United States Patent
Fu et al.

(10) Patent No.: US 7,335,282 B2
(45) Date of Patent: *Feb. 26, 2008

(54) SPUTTERING USING AN UNBALANCED MAGNETRON

(76) Inventors: Jianming Fu, 4631 Salina Dr., San Jose, CA (US) 95131; Praburam Gopalraja, 1235 Wildwood Ave., #277, Sunnyvale, CA (US) 94089; Fusen Chen, 13081 La Vista Ct., Saratoga, CA (US) 95070; John Forster, 465 10th Ave., #205, San Francisco, CA (US) 94103

(*) Notice: Subject to any disclaimer, the term of this patent is extended or adjusted under 35 U.S.C. 154(b) by 0 days.

This patent is subject to a terminal disclaimer.

(21) Appl. No.: 10/939,832

(22) Filed: Sep. 13, 2004

(65) Prior Publication Data

US 2005/0051424 A1    Mar. 10, 2005

Related U.S. Application Data

(60) Division of application No. 09/918,136, filed on Jul. 30, 2001, now Pat. No. 6,790,323, which is a division of application No. 09/546,798, filed on Apr. 11, 2001, now Pat. No. 6,306,265, which is a continuation-in-part of application No. 09/373,097, filed on Aug. 12, 1999, now Pat. No. 6,183,614, which is a continuation-in-part of application No. 09/249,468, filed on Feb. 12, 1999, now Pat. No. 6,290,825.

(51) Int. Cl.
*C23C 14/35* (2006.01)

(52) U.S. Cl. .......................... 204/192.12; 204/192.15; 204/298.2

(58) Field of Classification Search .......... 204/192.12, 204/192.15, 192.22, 298.2, 298.22, 298.19
See application file for complete search history.

(56) References Cited

U.S. PATENT DOCUMENTS 4,239,611 A    12/1980   Morrison, Jr. .............. 204/298

(Continued)

FOREIGN PATENT DOCUMENTS

DE           27 07 144    *  8/1977

(Continued)

OTHER PUBLICATIONS

Matsuoka et al., "Dense plasma production and film deposition by new high-rate sputtering using an electric mirror," *Journal of Vacuum Science and Technology A*, vol. 7, No. 4, Jul./Aug. 1989, pp. 2652-2657.

(Continued)

*Primary Examiner*—Rodney G. McDonald
(74) *Attorney, Agent, or Firm*—Law Office of Charles Guenzer

(57) ABSTRACT

A sputtering process and magnetron especially advantageous for low-pressure plasma sputtering or sustained self-sputtering, in which the magnetron has a reduced area but full target coverage. The magnetron includes an outer pole face surrounding an inner pole face with a gap therebetween. The outer pole of the magnetron of the invention is smaller than that of a circular magnetron similarly extending from the center to the periphery of the target and has a substantially larger total magnetic intensity. Thereby, sputtering at low pressure and high ionization fraction is enabled.

21 Claims, 11 Drawing Sheets

U.S. PATENT DOCUMENTS

| | | | |
|---|---|---|---|
| 4,312,731 A | 1/1982 | Morrison, Jr. | 204/192 R |
| 4,444,643 A | 4/1984 | Garrett | 204/298 |
| 4,601,806 A | 7/1986 | Wirz | 204/298 |
| 4,652,358 A | 3/1987 | Deppisch et al. | 204/298 |
| 4,717,462 A | 1/1988 | Homma et al. | 204/298.06 |
| 4,746,417 A | 5/1988 | Ferenbach et al. | 204/298 |
| 4,810,346 A | 3/1989 | Wolf et al. | 204/298 |
| 4,818,561 A | 4/1989 | Strahl | 427/38 |
| 4,872,964 A | 10/1989 | Suzuki et al. | 204/298 |
| 4,943,361 A | 7/1990 | Kakehi et al. | 204/192.32 |
| 4,963,239 A | 10/1990 | Shimamura et al. | 204/192.12 |
| 5,026,471 A | 6/1991 | Latz et al. | 204/298.19 |
| 5,047,130 A | 9/1991 | Akao et al. | 204/192.12 |
| 5,108,570 A * | 4/1992 | Wang | 204/192.3 |
| 5,120,417 A | 6/1992 | Takahashi et al. | 204/192.12 |
| 5,242,566 A | 9/1993 | Parker | 204/298.2 |
| 5,248,402 A | 9/1993 | Ballentine et al. | 204/298.2 |
| 5,252,194 A | 10/1993 | Demaray et al. | 204/298.2 |
| 5,262,028 A | 11/1993 | Manley | 204/192.12 |
| 5,284,564 A | 2/1994 | Maass | 204/298.2 |
| 5,320,728 A | 6/1994 | Tepman | 204/192.12 |
| 5,322,605 A | 6/1994 | Yamanishi | 204/298.07 |
| 5,334,302 A | 8/1994 | Kubo et al. | 204/298.18 |
| 5,415,754 A | 5/1995 | Manley | 204/192.12 |
| 5,514,259 A | 5/1996 | Shiota et al. | 204/298.19 |
| 5,536,362 A | 7/1996 | Love et al. | 156/643.1 |
| 5,556,519 A | 9/1996 | Teer | 204/192.12 |
| 5,584,971 A | 12/1996 | Komino | 204/192.13 |
| 5,593,551 A | 1/1997 | Lai | 204/192.12 |
| 5,599,739 A | 2/1997 | Merchant et al. | 438/628 |
| 5,650,052 A | 7/1997 | Edelstein et al. | 204/192.12 |
| 5,693,203 A * | 12/1997 | Ohhashi et al. | 204/298.12 |
| 5,746,897 A | 5/1998 | Heimanson et al. | 204/298.2 |
| 5,770,025 A | 6/1998 | Kiyota | 204/298.2 |
| 5,795,451 A | 8/1998 | Tan et al. | 204/298.2 |
| 5,824,197 A | 10/1998 | Tanaka | 204/192.12 |
| 5,833,817 A | 11/1998 | Tsai et al. | 204/192.17 |
| 5,879,523 A | 3/1999 | Wang et al. | 204/298.11 |
| 5,897,752 A | 4/1999 | Hong et al. | 204/192.12 |
| 5,944,968 A | 8/1999 | Kobayashi et al. | 204/298.2 |
| 5,966,607 A | 10/1999 | Chee et al. | 438/305 |
| 5,976,327 A | 11/1999 | Tanaka | 204/192.15 |
| 6,153,315 A * | 11/2000 | Yamakoshi et al. | 428/687 |
| 6,176,983 B1 * | 1/2001 | Bothra et al. | 204/192.17 |
| 6,183,614 B1 * | 2/2001 | Fu | 204/298.2 |
| 6,290,825 B1 * | 9/2001 | Fu | 204/298.2 |
| 6,440,282 B1 * | 8/2002 | Wada et al. | 204/298.2 |
| 6,582,569 B1 * | 6/2003 | Chiang et al. | 204/192.17 |
| 6,610,184 B2 * | 8/2003 | Ding et al. | 204/298.17 |
| 6,663,754 B2 * | 12/2003 | Gung | 204/298.19 |
| 6,790,323 B2 * | 9/2004 | Fu et al. | 204/192.17 |
| 6,852,202 B2 * | 2/2005 | Miller et al. | 204/192.13 |
| 2001/0052456 A1 | 12/2001 | Fu | 204/192.17 |

FOREIGN PATENT DOCUMENTS

| | | |
|---|---|---|
| EP | 0-620-583A1 | 10/1994 |
| EP | 0 691 419 A1 * | 1/1996 |
| JP | 62-89864 | 4/1987 |
| JP | 63-282263 | 11/1988 |
| JP | 64-28921 | 1/1989 |
| JP | 5-1373 | 1/1993 |
| JP | 7-126844 | 5/1995 |
| JP | 7-252651 | 10/1995 |
| JP | 10-88336 | 7/1996 |
| JP | 9-41135 | 2/1997 |
| JP | 10-088339 A | 4/1998 |
| JP | 10-152774 | 6/1998 |
| JP | 11-74225 | 3/1999 |
| WO | WO 00/48226 | 8/2000 |

OTHER PUBLICATIONS

B. Window et al. "Charged particle fluxes from planar magnetron sputtering sources", *J. Vac. Sci. Technol. A*, vol. 4, No. 2, Mar./Apr. 1986, pp. 196-202.

J. Musil, et al. "Unbalanced magnetrons and new sputtering systems with enhanced plasma ionization", *J. Vac. Sci. Technol. A*, vol. 9, No. 3, May/Jun. 1991, pp. 1171-1177.

W. Munz, "The unbalanced magnetron: current status of development", *Surface and Coatings Technology*, vol. 48, 1991, pp. 81-94.

Posadowski et al., "Sustained self-sputtering using a direct current magnetron source," *Journal of Vacuum Science and Technology A*, vol. 11, No. 6, Nov./Dec. 1993, pp. 2980-2984.

* cited by examiner though the pedestal and wafer are left electrically floating as well.

SPUTTERING USING AN UNBALANCED MAGNETRON

RELATED APPLICATIONS

This application is a division of Ser. No. 09/918,136, filed Jul. 30, 2001, now issued on Sep. 14, 2004 as U.S. Pat. No. 6,790,323, which is a division of Ser. No. 09/546,798, filed Apr. 11, 2001, now issued as U.S. Pat. No. 6,306,265, which is a continuation in part of Ser. No. 09/373,097, filed Aug. 12, 1999, now issued as U.S. Pat. No. 6,183,614, which is a continuation in part of Ser. No. 09/249,468, filed Feb. 12, 1999, now issued as U.S. Pat. No. 6,290,825, all of which are incorporated herein by reference in their entireties.

FIELD OF THE INVENTION

The invention relates generally to sputtering of materials. In particular, the invention relates to the magnetron creating a magnetic field to enhance sputtering and the resultant sputtering methods.

BACKGROUND ART

Sputtering, alternatively called physical vapor deposition (PVD), is the most prevalent method of depositing layers of metals and related materials in the fabrication of semiconductor integrated circuits. A conventional PVD reactor 10 is illustrated schematically in cross section in FIG. 1, and the illustration is based upon the Endura PVD Reactor available from Applied Materials, Inc. of Santa Clara, Calif. The reactor 10 includes a vacuum chamber 12 sealed to a PVD target 14 composed of the material, usually a metal, to be sputter deposited on a wafer 16 held on a heater pedestal 18. A shield 20 held within the chamber protects the chamber wall 12 from the sputtered material and provides the anode grounding plane. A selectable DC power supply 22 negatively biases the target 14 to about −600VDC with respect to the shield 20. Conventionally, the pedestal 18 and hence the wafer 16 are left electrically floating.

A gas source 24 supplies a sputtering working gas, typically the chemically inactive gas argon, to the chamber 12 through a mass flow controller 26. In reactive metallic nitride sputtering, for example, of titanium nitride, nitrogen is supplied from another gas source 27 through its own mass flow controller 26. Oxygen can also be supplied to produce oxides such as $Al_2O_3$. The gases can be admitted to the top of the chamber, as illustrated, or at its bottom, either with one or more inlet pipes penetrating the bottom of the shield or through the gap between the shield 20 and the pedestal 18. A vacuum system 28 maintains the chamber at a low pressure. Although the base pressure can be held to about $10^{-7}$ Torr or even lower, the pressure of the working gas is typically maintained at between about 1 and 1000 mTorr. A computer-based controller 30 controls the reactor including the DC power supply 22 and the mass flow controllers 26.

When the argon is admitted into the chamber, the DC voltage between the target 14 and the shield 20 ignites the argon into a plasma, and the positively charged argon ions are attracted to the negatively charged target 14. The ions strike the target 14 at a substantial energy and cause target atoms or atomic clusters to be sputtered from the target 14. Some of the target particles strike the wafer 16 and are thereby deposited on it, thereby forming a film of the target material. In reactive sputtering of a metallic nitride, nitrogen is additionally admitted into the chamber 12, and it reacts with the sputtered metallic atoms to form a metallic nitride on the wafer 16.

To provide efficient sputtering, a magnetron 32 is positioned in back of the target 14. It has opposed magnets 34, 36 creating a magnetic field within the chamber in the neighborhood of the magnets 34, 36. The magnetic field traps electrons and, for charge neutrality, the ion density also increases to form a high-density plasma region 38 within the chamber adjacent to the magnetron 32. The magnetron 32 is usually rotated about the center of the target 14 to achieve full coverage in sputtering of the target 14. The form of the magnetron is a subject of this patent application, and the illustrated form is intended to be only suggestive.

The advancing level of integration in semiconductor integrated circuits has placed increasing demands upon sputtering equipment and processes. Many of the problems are associated with contact and via holes. As illustrated in the cross-sectional view of FIG. 2, via or contact holes 40 are etched through an interlevel dielectric layer 42 to reach a conductive feature 44 in the underlying layer or substrate 46. Sputtering is then used to fill metal into the hole 40 to provide inter-level electrical connections. If the underlying layer 46 is the semiconductor substrate, the filled hole 40 is called a contact; if the underlying layer is a lower-level metallization level, the filled hole 40 is called a via. For simplicity, we will refer hereafter only to vias. The widths of inter-level vias have decreased to the neighborhood of 0.25 µm and below while the thickness of the inter-level dielectric has remained nearly constant at around 0.7 µm. As a result, the via holes in advanced integrated circuits have increased aspect ratios of three and greater. For some technologies under development, aspect ratios of six and even greater are required.

Such high aspect ratios present a problem for sputtering because most forms of sputtering are not strongly anisotropic, a cosine dependence off the vertical being typical, so that the initially sputtered material preferentially deposits at the top of the hole and may bridge it, thus preventing the filling of the bottom of the hole and creating a void in the via metal.

It has become known, however, that deep hole filling can be facilitated by causing a significant fraction of the sputtered particles to be ionized in the plasma between the target 14 and the pedestal 18. The pedestal 18 of FIG. 1, even if it is left electrically floating, develops a DC self-bias, which attracts ionized sputtered particles from the plasma across the plasma sheath adjacent to the pedestal 18 and deep into the hole 40 in the dielectric layer 42. The effect can be accentuated with additional DC or RF biasing of the pedestal electrode 18 to additionally accelerate the ionized particles extracted across the plasma sheath towards the wafer 16, thereby controlling the directionality of sputter deposition. The process of sputtering with a significant fraction of ionized sputtered atoms is called ionized metal deposition or ionized metal plating (IMP). Two related quantitative measures of the effectiveness of hole filling are bottom coverage and side coverage. As illustrated schematically in FIG. 2, the initial phase of sputtering deposits a layer 50, which has a surface or blanket thickness of $s_1$, a bottom thickness of $s_2$, and a sidewall thickness of $s_3$. The bottom coverage is equal to $s_2/s_1$, and the sidewall coverage is equal to $s_3/s_1$. The model is overly simplified but in many situations is adequate.

One method of increasing the ionization fraction is to create a high-density plasma (HDP), such as by adding an RF coil around the sides of the chamber 12 of FIG. 1. An HDP reactor not only creates a high-density argon plasma but also increases the ionization fraction of the sputtered atoms. However, HDP PVD reactors are new and relatively expensive, and the quality of the deposited films is not always the best. It is desired to continue using the principally DC sputtering of the PVD reactor of FIG. 1.

Another method for increasing the ionization ratio is to use a hollow-cathode magnetron in which the target has the shape of a top hat. This type of reactor, though, runs very hot and the complexly shaped targets are very expensive.

It has been observed that copper sputtered with either an inductively coupled HDP sputter reactor or a hollow-cathode reactor tends to form an undulatory copper film on the via sidewall, and further the deposited metal tends to dewet. The variable thickness is particularly serious when the sputtered copper layer is being used as a seed layer of a predetermined minimum thickness for a subsequent deposition process such as electroplating to complete the copper hole filling.

A further problem in the prior art is that the sidewall coverage tends to be asymmetric with the side facing the center of the target being more heavily coated than the more shielded side facing a larger solid angle outside the target. Not only does the asymmetry require excessive deposition to achieve a seed layer of predetermined minimum thickness, it causes cross-shaped trenches used as alignment indicia in the photolithography to appear to move as the trenches are asymmetrically narrowed.

Another operational control that promotes deep hole filling is chamber pressure. It is generally believed that lower chamber pressures promote hole filling. At higher pressures, there is a higher probability that sputtered particles, whether neutral or ionized, will collide with atoms of the argon carrier gas. Collisions tend to neutralize ions and to randomize velocities, both effects degrading hole filling. However, as described before, the sputtering relies upon the existence of a plasma at least adjacent to the target. If the pressure is reduced too much, the plasma collapses, although the minimum pressure is dependent upon several factors.

The extreme of low-pressure plasma sputtering is sustained self-sputtering (SSS), as disclosed by Fu et al. in U.S. patent application, Ser. No. 08/854,008, filed May 8, 1997 and now issued as U.S. Pat. No. 6,692,617. In SSS, the density of positively ionized sputtered atoms is so high that a sufficient number are attracted back to the negatively biased target to resputter more ionized atoms. Under the right conditions for a limited number of target metals, the self-sputtering sustains the plasma, and no argon working gas is required. Copper is the metal most prone to SSS, but only under conditions of high power and high magnetic field. Copper sputtering is being seriously developed because of copper's low resistivity and low susceptibility to electromigration. However, for copper SSS to become commercially feasible, a full-coverage, high-field magnetron needs to be developed.

Increased power applied to the target allows reduced pressure, perhaps to the point of sustained self-sputtering. The increased power also increases the ionization density. However, excessive power requires expensive power supplies and increased cooling. Power levels in excess of 30 kW are expensive and should be avoided if possible. In fact, the pertinent factor is not power but the power density in the area below the magnetron since that is the area of the high-density plasma promoting effective sputtering. Hence, a small, high-field magnet would most easily produce a high ionization density. For this reason, some prior art discloses a small circularly shaped magnet. However, such a magnetron requires not only rotation about the center of the target to provide uniformity, but it also requires radial scanning to assure full and fairly uniform coverage of the target. If full magnetron coverage is not achieved, not only is the target not efficiently used, but more importantly the uniformity of sputter deposition is degraded, and some of the sputtered material redeposits on the target in areas that are not being sputtered. Furthermore, the material redeposited on unsputtered areas may build up to such a thickness that it is prone to flake off, producing severe particle problems. While radial scanning can potentially avoid these problems, the required scanning mechanisms are complex and generally considered infeasible in a production environment.

One type of commercially available magnetron is kidney-shaped, as exemplified by Tepman in U.S. Pat. No. 5,320,728. Parker discloses more exaggerated forms of this shape in U.S. Pat. No. 5,242,566. As illustrated in plan view in FIG. 3, the Tepman magnetron 52 is based on a kidney shape for the magnetically opposed pole faces 54, 56 separated by a circuitous gap 57 of nearly constant width. The pole faces 54, 56 are magnetically coupled by unillustrated horseshoe magnets bridging the gap 57. The magnetron rotates about a rotational axis 58 at the center of the target 14 and near the concave edge of the kidney-shaped inner pole face 54. The convexly curved outer periphery of the outer pole face 56, which is generally parallel to the gap 57 in that area, is close to the outer periphery of the usable portion if the target 14. This shape has been optimized for high field and for uniform sputtering but has an area that is nearly half that of the target. It is noted that the magnetic field is relatively weak in areas separated from the pole gap 57.

For these reasons, it is desirable to develop a small, high-field magnetron providing full coverage so as to promote deep hole filling and sustained copper self-sputtering.

SUMMARY OF THE INVENTION

The invention includes a sputtering magnetron having an oval or related shape of smaller area than a circle of equal diameter where the two diameters extend along the target radius with respect to the typical rotation axis of the magnetron. The shapes include racetracks, ellipses, egg shapes, triangles, and arced triangles asymmetrically positioned about the target center.

The magnetron is rotated on the backside of the target about a point preferably near the magnetron's thin end, and the thicker end is positioned more closely to the target periphery. Preferably, the total magnetic flux is greater outside than inside the half radius of the target.

The magnetic intensity away from the target can be increased for a triangular magnetron having a relatively small apex angle by using bar magnets.

The small area allows an electrical power density of at least 600 W/cm$^2$ to be applied from an 18 kW power supply to a fully covered sputtering target used to sputter deposit a 200 mm wafer.

The high power density and the magnetic field extending far away from the target are two means possible to produce a plasma wave which can further drive the plasma to a higher density and ionization. Advantageously, a primary plasma wave is generated at a higher frequency in the range of hundreds of megahertz, which is parametrically converted to another wave at a much lower frequency, for example, 5 to 75 MHz, corresponding to the thermal velocity of electrons in the plasma produced by capacitively coupling DC power to the target.

The magnetron is configured to produce less magnetic flux in its inner pole than in its surrounding outer pole.

Thereby, the magnetic field reaches further into the sputtering chamber to promote low-pressure sputtering and sustained self-sputtering.

The invention also includes sputtering methods achievable with such a magnetron. The high magnetic field extending over a small closed area facilitates sustained self-sputtering. Many metals not subject to sustained self-sputtering can be sputtered at chamber pressures of less than 0.5 milliTorr, often less than 0.2 milliTorr, and even at 0.1 milliTorr. The bottom coverage can be further improved by applying an RF bias of less than 250 W to a pedestal electrode sized to support a 200 mm wafer. Copper can be sputtered with 18 kW of DC power for a 330 mm target and 200 mm wafer either in a fully self-sustained mode or with a minimal chamber pressure of 0.3 milliTorr or less.

The invention provides for high-power density sputtering with power supplies of reduced capacity.

The invention also includes sputtering under conditions, such as a sufficiently high target power and high magnetic field away from the target, that a non-linear wave-beam interaction occurs that pumps energy into plasma electrons, thereby increasing the plasma density.

DETAILED DESCRIPTION OF THE PREFERRED EMBODIMENTS

Figure 4:
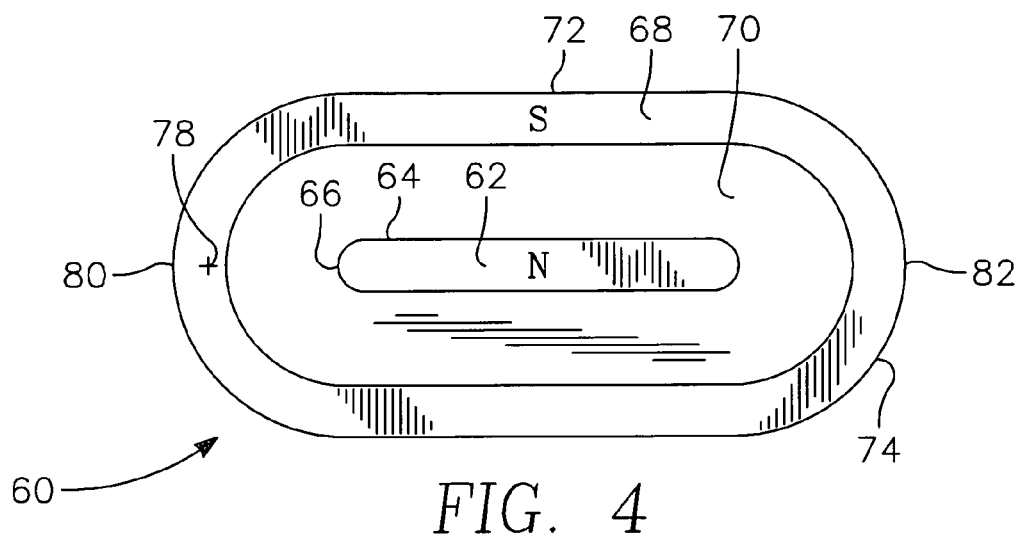
FIG. 4 is a plan view of the pole pieces of an embodiment of the magnetron of the invention taken along the view line 4—4 of FIG. 7.

One embodiment of the invention is a racetrack magnetron 60, illustrated in plan view in FIG. 4. The racetrack magnetron 60 has a central bar-shaped pole face 62 of one magnetic polarity having opposed parallel middle straight sides 64 connected by two rounded ends 66. The central, bar-shaped pole face 62 is surrounded by an outer elongated ring-shaped pole face 68 of the other polarity with a gap 70 of nearly constant width separating the bar-shaped and ring-shaped pole faces 62, 68. The outer pole face 68 of the other magnetic polarity includes opposed parallel middle straight sections 72 connected by two rounded ends 74 in general central symmetry with the inner pole face 62. The middle sections 72 and rounded ends 74 are bands having nearly equal widths. Magnets, to be described shortly, cause the pole faces 62, 68 to have opposed magnetic polarities. A backing plate, also to be described shortly, provides both a magnetic yoke between the magnetically opposed pole faces 62, 68 and support for the magnetron structure.

Although the two pole faces 62, 68 are illustrated with specific magnetic polarities producing magnetic fields extending generally perpendicularly to the plane of illustration, it is of course appreciated that the opposite set of magnetic polarities will produce the same general magnetic effects as far as the invention is concerned. The illustrated assembly produces a generally semi-toroidal magnetic field having parallel arcs extending perpendicularly to a closed path with a minimal field-free region in the center. There results a closed tunnel of magnetic field lines forming struts of the tunnel.

The pole assembly of FIG. 4 is intended to be continuously rotated during sputter deposition at a fairly high rotation rate about a rotation axis 78 approximately coincident with the center of the target 14 of uniform composition. The rotation axis 78 is located at or near one prolate end 80 of the outer pole face 68 and with its other prolate end 82 located approximately at the outer radial usable extent of the target 14. The asymmetric placement of the rotating magnetron 60 with respect to the target center provides a small magnetron nonetheless achieving full target coverage. The outer usable periphery of the target is not easily defined because different magnetron designs use different portions of the same target. However, it is bounded by the flat area of the target and almost always extends to significantly beyond the diameter of the wafer being sputter deposited and is somewhat less than the area of the target face. For 200 mm wafers, target faces of 325 mm are typical. A 15% unused target radius may be considered as an upper practical limit. Racetrack magnetrons are well known in the prior art, but they are generally positioned symmetrically about the center of the target. In the described invention, the racetrack is asymmetrically positioned with its inner end either overlying the target center or terminating at a radial position preferably within 20% and more preferably within 10% of the target radius from the target center. The illustrated racetrack extends along a diameter of the target.

Figure 5:
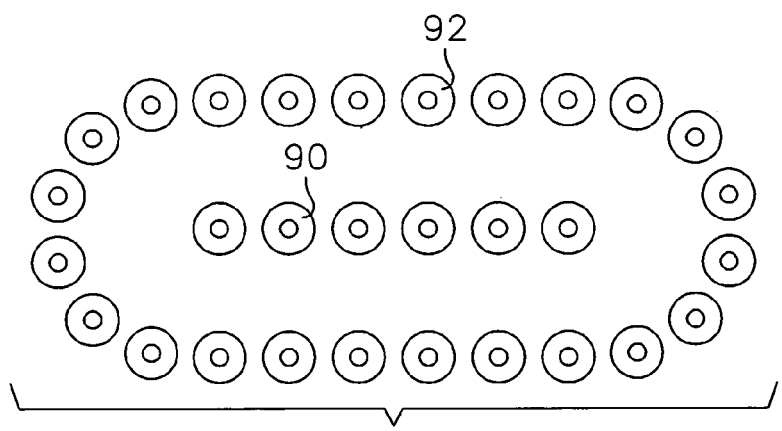
FIG. 5 is a plan view of the magnets used in the magnetron of FIG. 4.

As illustrated in the plan view of FIG. 5, two sets of magnets 90, 92 are disposed in back of the pole faces 62, 68 to produce the two magnetic polarities. The combination of the pole faces 62, 68, the magnets 90, 92, and possibly a back magnetic yoke produces two opposite magnetic poles having areas defined by the pole faces 62, 68. Other means may be used to achieved such poles.

Figure 6:
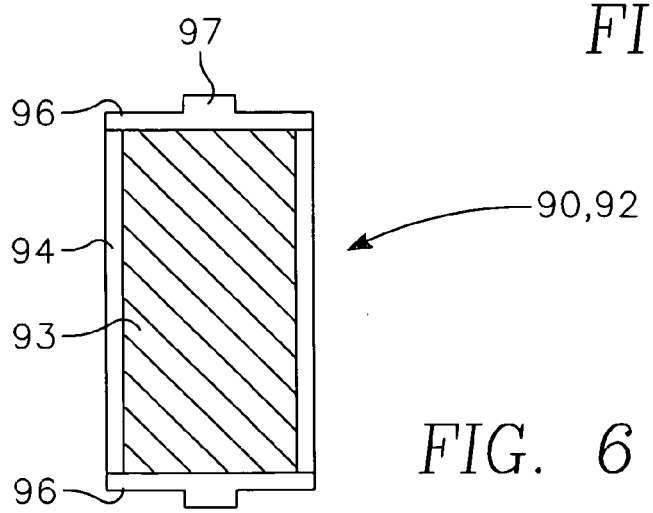
FIG. 6 is a cross-sectional view of one of the magnets used in conjunction with the embodiments of the invention.

The two types of magnets 90, 92 may be of similar construction and composition producing an axially extending magnetic flux on each vertically facing end. If they are of different, magnetic composition, diameter, or length, the flux produced by different magnets may be different. A cross-sectional view of a magnet 90, 92 is shown in FIG. 6. A cylindrical magnetic core 93 extending along an axis is composed of a strongly magnetic material, such as neodymium boron iron (NdBFe). Because such a material is easily oxidized, the core 93 is encapsulated in a case made of a tubular sidewall 94 and two generally circular caps 96 welded together to form an air-tight canister. The caps 96 are composed of a soft magnetic material, preferably SS410 stainless steel, and the tubular sidewall 96 is composed of a non-magnetic material, preferably SS304 stainless steel. Each cap 96 includes an axially extending pin 97, which engages a corresponding capture hole in one of the pole faces 62, 68 or in a magnetic yoke to be shortly described. Thereby, the magnets 90, 92 are fixed in the magnetron. The magnetic core 93 is magnetized along its axial direction, but the two different types of magnets 90, 92 are oriented in the magnetron 60, as illustrated in the cross-sectional view of FIG. 7, so that the magnets 90 of the inner pole 62 are aligned to have their magnetic field extending vertically in one direction, and the magnets 92 of the outer pole 68 are aligned to have their magnetic field extending vertically in the other direction. That is, they have opposed magnetic polarities.

Figure 7:
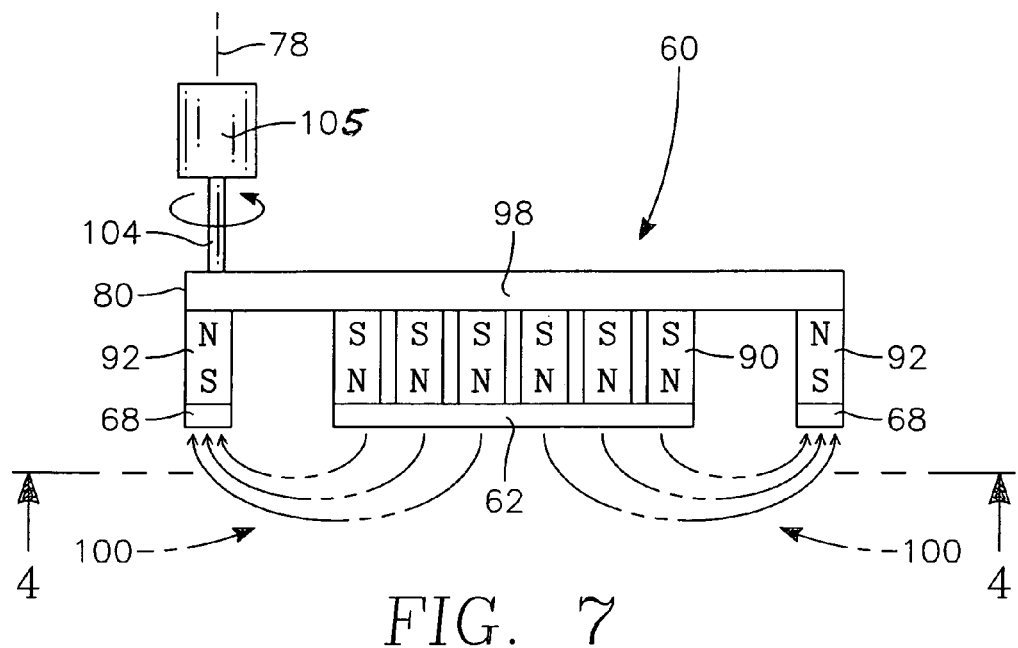
FIG. 7 is a cross-sectional view of the magnetron of FIG. 4.

As illustrated in the cross-sectional view of FIG. 7, the magnets 90, 92 are arranged closely above (using the orientation of FIG. 1) the pole faces 62, 68 located just above the back of the target 14. A magnetic yoke 98 having a generally closed shape generally conforming to the outer periphery of the outer pole face 68 is closely positioned in back of the magnets 90, 92 to magnetically couple the two poles 62, 68. As mentioned previously, holes in the pole faces 62, 68 and in the yoke 98 fix the magnets 90, 92, and unillustrated hardware fix the pole faces 62, 68 to the yoke 98.

The inner magnets 90 and inner pole face 62 constitute an inner pole of one magnetic polarity while the outer magnets 92 and the outer pole face 68 constitute a surrounding outer pole of the other magnetic polarity. The magnetic yoke 98 magnetically couples the inner and outer poles and substantially confines the magnetic field on the back or top side of the magnetron to the yoke 98. A semi-toroidal magnetic field 100 is thereby produced, which extends through the non-magnetic target 14 into the vacuum chamber 12 to define the high-density plasma region 38. The field 100 extends through the non-magnetic target 14 into the vacuum chamber 12 to define the extent of the high-density plasma region 38. The magnets 90, 92 may be of different magnetic strength. However, it is desired for reasons to be explained later that the total magnetic flux produced by the outer magnets 92 be substantially greater than that produced by the inner magnets 90. As illustrated, the magnetron 60 extends horizontally from approximately the center of the target 14 to the edge of the usable area of the target 14. The magnetic yoke 90 and the two pole faces 62, 68 are preferably plates formed of a soft magnetic material such as SS416 stainless steel.

The inner prolate end 80 of the magnetron 60 is connected to a shaft 104 extending along the rotation axis 78 and rotated by a motor 105. As illustrated, the magnetron 60 extends horizontally from approximately the center of the target 14 to the right hand side of the usable area of the target 14. Demaray et al. in U.S. Pat. No. 5,252,194 disclose exemplary details of the connections between the motor 105, the magnetron 60, and the vacuum chamber 12. The magnetron assembly 60 should include counter-weighting to avoid flexing of the shaft 104. Although the center of rotation 78 is preferably disposed within the inner prolate end 74 of the outer pole face 72, its position may be optimized to a slightly different position, but one preferably not deviating more than 20%, more preferably 10%, from the inner prolate end 80 as normalized to the prolate length of the magnetron 60. Most preferably, the inner end of the outer pole face 68 near the prolate end 80 overlies the rotation center 78.

The racetrack configuration of FIG. 4 has the advantage of simplicity and a very small area while still providing full target coverage. As will be discussed later, the asymmetric magnetic flux of the two poles is advantageous for low-pressure sputtering and sustained self-sputtering.

The racetrack configuration of FIG. 4 can be alternatively characterized as an extremely flattened oval. Other oval shapes are also included within the invention, for example, continuously curved shapes of continuously changing diameter such as elliptical shapes with the major axis of the ellipse extending along the radius of the target and with the minor axis preferably parallel to a rotational circumference. Tabuchi illustrates a symmetric oval magnetron in Laid-open Japanese Patent Application 63-282263. This shape however has the disadvantage of a complex shape, especially for packing the magnets in the inner pole.

Figure 8:
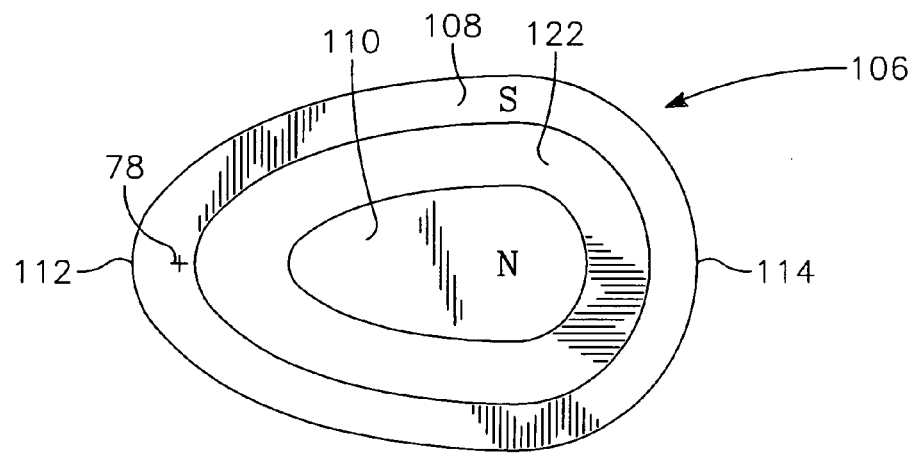
FIG. 8 is a plan view of an egg-shaped magnetron.

Another oval shape is represented by an egg-shaped magnetron 106, illustrated in plan view in FIG. 8. It has an outer pole face 108 of one magnetic polarity surrounding an inner pole face 110 of the other polarity with a nearly constant gap 122 between them. Both pole faces 108, 110 are shaped like the outline of an egg with a major axis extending along the radius of the target. However, an inner end 112 of the outer pole face 108 near the rotation axis 78 is sharper than an outer end 114 near the periphery of the target. The egg shape is related to an elliptical shape but is asymmetric with respect to the target radius. Specifically, the minor axis is pushed closer to the target periphery than its center. The inner pole face 110 and the gap 122 are similarly shaped. Such an egg shape places more of the magnetic flux closer to the target periphery so as to improve sputtering uniformity. Such a preferred flux distribution may be characterized with respect to the half radius of the target extending from its center to its outer usable radius. For improved uniformity, the total magnetic flux located outside the half radius is greater than that located inside the half radius, for example, by at least a 3:2 ratio, and preferably between 1.8 and 2.3. The ratio of magnetic flux outside to inside the target half radius in this configuration is about 2:1.

Figure 9:
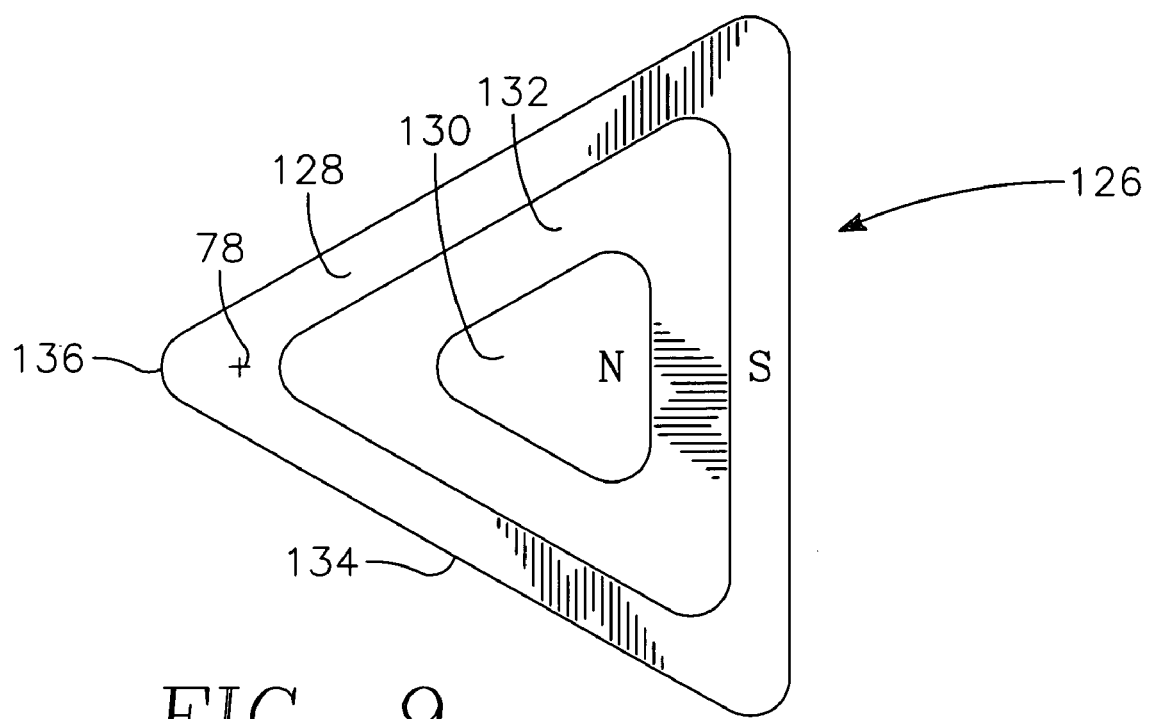
FIG. 9 is a plan view of a triangularly shaped magnetron.

A related shape is represented by a triangular magnetron 126, illustrated in plan view in FIG. 9. It has a triangular outer pole face 128 of one magnetic polarity surrounding a substantially solid inner pole face 130 of the other magnetic polarity with a gap 132 between them. The triangular shape of the inner pole face 130 with rounded corners allows hexagonal close packing of the button magnets 90, 92 of FIG. 6. The outer pole face 128 has three straight sections 134, which are preferably offset by 60° with respect to each other and are connected by rounded corners 136. Preferably, the rounded corners 136 have smaller lengths than the straight sections 134. One rounded corner 136 is located near the rotation center 78 and target center, preferably within 20%, more preferably within 10% of the target radius, and most preferably with the apex portion of the outer pole face 128 overlying the rotation center 78. The triangularly shaped inner pole piece 130 may include a central aperture, but it is preferred that the size of such an aperture be kept small to minimize the size of the central magnetic cusp.

Figure 10:
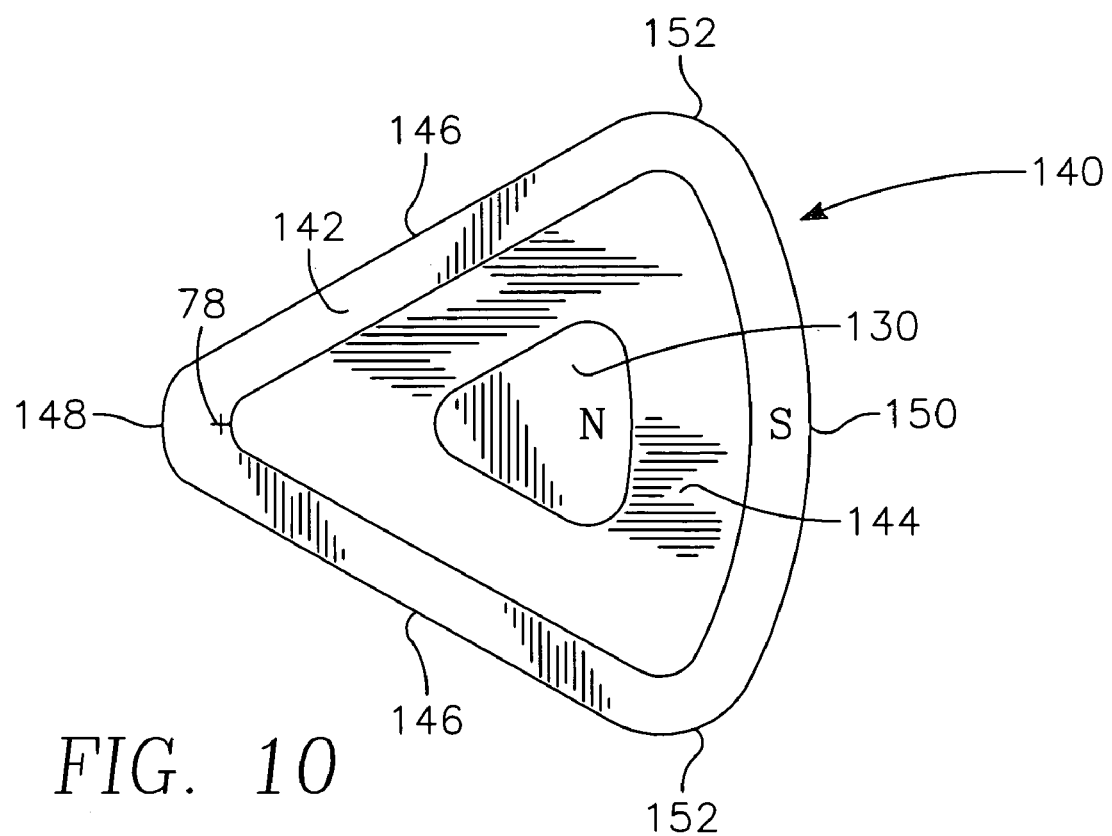
FIG. 10 is a plan view of a modification of the triangularly shaped magnetron of FIG. 9, referred to as an arced triangular magnetron.

A modified triangular shape is represented by an arced triangular magnetron 140 of FIG. 10. It includes the triangular inner pole face 130 surrounded by an arced triangular outer pole face 142 with a gap 144 between them and between the magnets of the respective poles and with the magnetic yoke in back of the gap 144. The outer pole face 142 includes two straight sections 146 connected to each other by a rounded apex corner 148 and connected to an arc section 150 by rounded circumferential corners 152. The apex corner 148 is placed near the rotational center 78 and the target center, preferably within 20% and more preferably within 10% of the target radius. The arc section 150 is located generally near the circumferential periphery of the target. It curvature may be equal to that of the target, that is, be equidistant from the center of rotation 78, but other optimized curvatures may be chosen for an arc section concave with respect to the rotational center 78. It is located near the target periphery within the chamber, preferably within 25% and more preferably within 15% of the radius to the periphery. Yokoyama et al. in Laid-open Japanese Patent Application 62-89864 discloses the advantage of a plurality of arced triangular magnetrons arranged symmetrically about the target center. However, plural magnetrons do not provide for a small total area and thus do not achieve a high power density for sputtering. Furthermore, the apices of the individual magnetron sections in Yokoyama et al. are located relatively far from the target center, thus producing poor sputtering uniformity except for a large number of sections.

Figure 11:
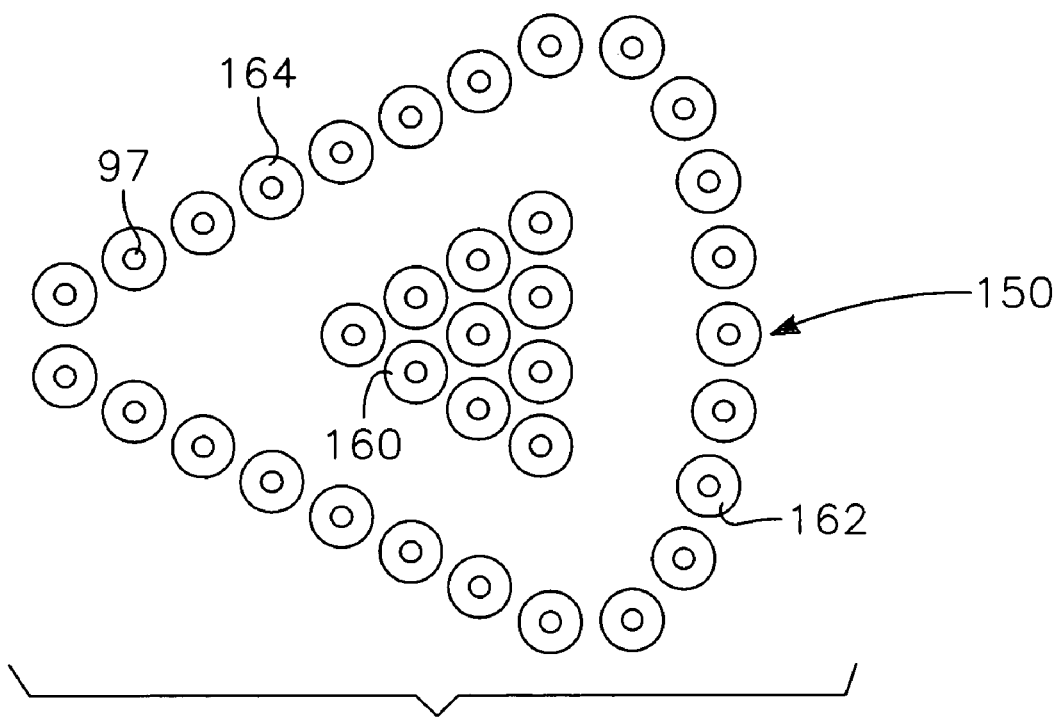
FIG. 11 is a plan view of the magnets used in the arced triangular magnetron of FIG. 10.

The magnetic field is produced by an arrangement of magnets shown in plan view in FIG. 11. Magnets 160 of a first polarity are disposed adjacent to the inner pole face 130 in an advantageous hexagonally close-packed arrangement. Magnets 162 of a second polarity are arranged adjacent to the arc section 150 of the outer pole face 142 while magnets 164 of the second polarity are arranged adjacent to the remaining portions of the outer pole face 142. In some situations, to be described later, it is advantageous to place magnets of different intensities at different portions of the outer pole face 142. In one embodiment, there are 10 magnets in the inner pole and 26 magnets in the outer pole, which for magnets of equal strength produces 2.6 more magnetic flux in the outer pole than in the inner pole.

Figure 12:
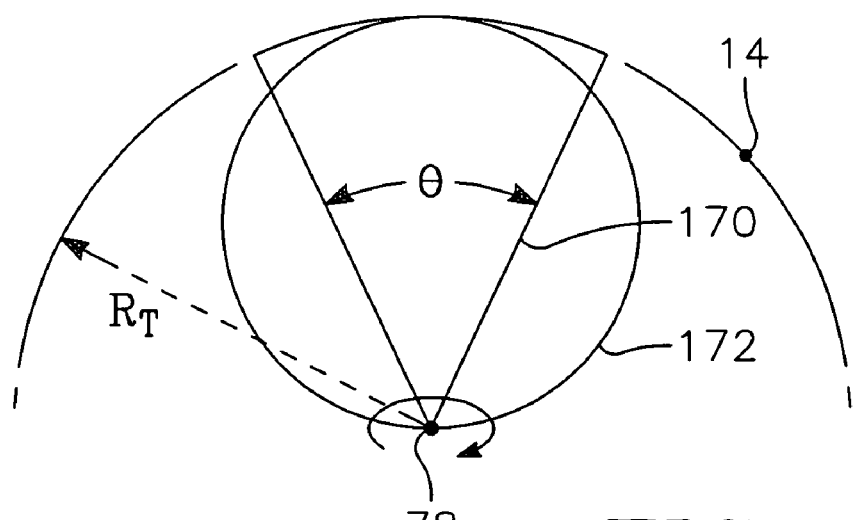
FIG. 12 is a plan view of two model magnetrons used to calculate areas and peripheral lengths.
Figure 13:
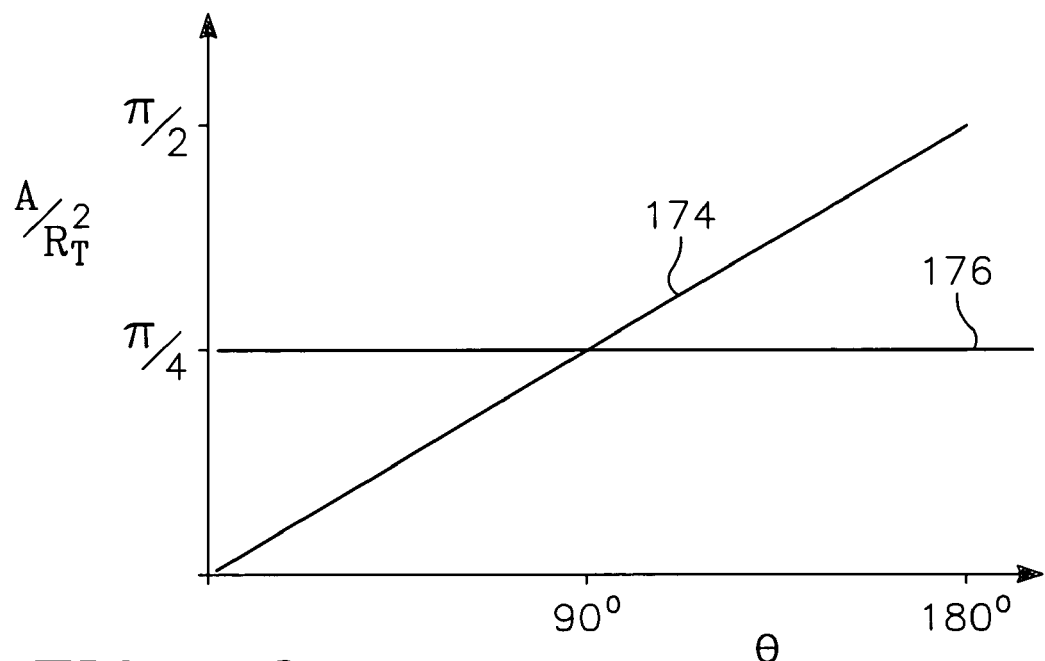
FIG. 13 is a graph of the angular dependences of the areas of a triangular and of a circular magnetron.
Figure 14:
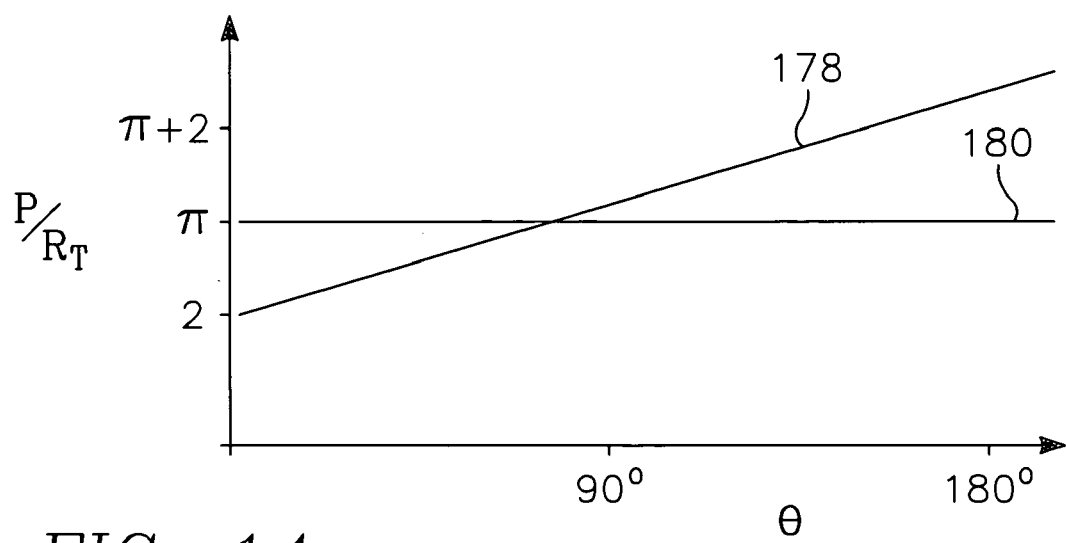
FIG. 14 is a graph of the angular dependences of the peripheral lengths of the two types of magnetrons of FIG. 12.

The triangular magnetrons 126, 140 of FIGS. 9 and 10 are illustrated as having apex angles θ of 60°, which facilitates promotes hexagonal close packing of the button magnets, but the apex angle can be changed, in particular decreased below 60°. However, 60°±15° seems to provide superior uniformity. The apex angle significantly affects two important parameters of the magnetron of the invention, the values of its area A and its perimeter P. Some simple calculations, most easily done for the arced triangular magnetron 140, show the general effects of changing the apex angle θ, as illustrated in plan view in FIG. 12. A simplified or model arced triangular magnetron 170 has two straight sides extending between the center and periphery of the target 14 of radius $R_T$ and meeting at an apex coincident with the rotation axis 78 and further includes an arc side conforming to the usable periphery of the target 14. The area A of the simplified arced triangular magnetron 170 is $\theta R_T^2/2$, and its periphery P is $R_T(2+\theta)$, where θ is measured in radians. Also illustrated in FIG. 12 is a model circular magnetron 172 having a radius of $R_T/2$ and having a diameter fixed to the rotation axis 78. It has an area A of $\pi R_T^2/4$ and a periphery P of $\pi R_T$. Both magnetrons 170, 172 provide full target coverage. The dependence of the arced triangular area A upon the apex angle θ is plotted in normalized units in FIG. 13 by line 174 and that for the circular area by line 176. Below 90°, the triangular area is smaller. The dependence of the triangular periphery P is plotted in FIG. 14 by line 178 and that for the circular periphery by line 180. Below 65.4°, the arced triangular periphery is smaller. Ionization efficiency is increased by minimizing the area, since the target power is concentrated in a smaller area, and is also increased by minimizing the periphery, since edge loss is generally proportional to the peripheral length. Of course, the area needs to be large enough to accommodate the magnets creating the magnetic field. Also, these calculations do not address uniformity. It is likely that the circular magnetron 170 provides reduced uniformity relative to the arced triangular magnetron 172.

The ratio of the magnetic flux outside to inside the target half radius for the arced triangular magnetron 172 can be approximated by the lengths of the sides 170 in the two regions by (1+θ), which is 1.79 for an apex angle θ of 45°, 2.05 for 60°, 2.31 for 75°, and 2.57 for 90°.

A variation of the arced triangular arrangement of FIGS. 10 and 11 decreases the apex angle to, for example, 47°. In addition to the hexagonally close packed inner magnets 160, one or more inner magnets are linearly arranged from the inner corner of hexagonally closed packed magnets toward the inner corner of the outer magnets 164. The result is intermediate the racetrack magnetron and the arced triangular magnetron.

The experimental work producing the process results presented below has demonstrated the advantage of a small magnetron area. If the triangular magnetron configuration of FIGS. 11 and 12 is adjusted to have significantly smaller apex angle θ with a reduced gap between the inner and outer poles, the total magnetic flux produced is limited by the permeability of the magnets. Therefore, as the apex angle and gap are decreased, the magnetic field across the gap does not extend so far away from the magnetron. As a result, the high-density plasma extends over an increasingly shallow height in front of the target. One approach to increase the effective magnetic flux is to use bar magnets instead of button magnets. The bar magnets have a larger fill factor in the pole area so that for a given total area and a maximum magnetic permeability (per unit area of magnet), a large magnet flux is produced.

Figure 15:
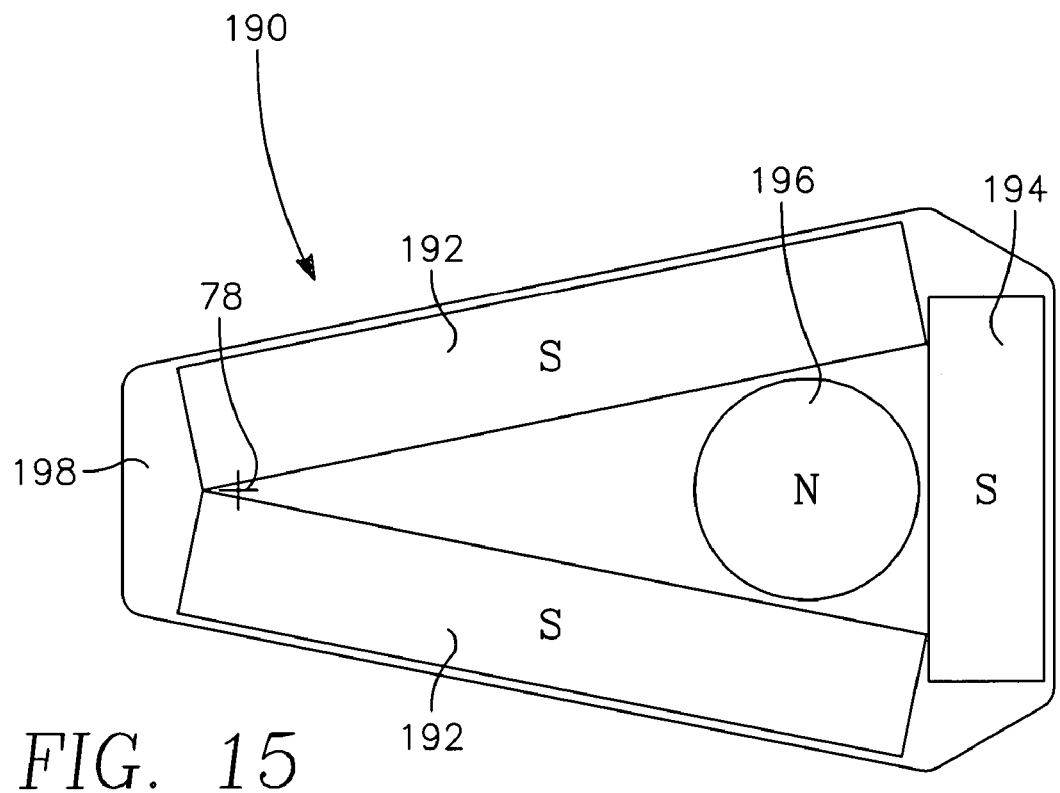
FIG. 15 is a bottom plan view of a magnetron of the invention using bar magnets.

A bottom plan view of such a magnetron 190 is illustrated in FIG. 15. Two long side bar magnets 192 and one shorter base bar magnets 194, each of a same first vertical magnetic polarization are arranged in a triangular shape having an apex angle of, for example, 15°. By a bar magnet is meant a magnet having at least one pair of parallel sides extending in a direction perpendicular to the direction of magnetization. The illustrated magnets 192, 194 have two pairs of parallel sides so that they are rectangular. However, it is possible that one or both ends are shaped, especially the end near the apex. A circular central magnet 196 of the opposed second vertical magnetic polarization is mostly surrounded by the bar magnets 192, 194. The sides of the magnets 192, 194, 196 opposite the target are magnetically coupled by a triangular magnetic yoke 198 although the shape of the yoke 198 is not that important as long as the yoke 198 supports the otherwise separate and disconnected magnets 192, 194, 196 and magnetically couples them. The rotation axis 78 for the yoke 198 and the magnets 192, 194, 196 is located near the apex of the triangular shape. The base outer magnet 194 is located near the target periphery just outside of the intended sputtering area of the target. No separate pole face is required on the sides of the magnets facing the target since the magnets provide a fairly uniform magnetic field. The fill factor for a single line of circular magnets is π/4=0.79 compared to a bar magnet of equal width so that the bar magnet is capable of producing 20% higher total magnetic flux.

The illustrated triangular magnetron 190 has an apex angle of 23°. Other angles may be chosen, but the bar magnets seem particularly applicable when the apex angle is between 10° and 35° although apex angles of between 20° and 30° are more realistic. Also, the advantages of the bar magnets are mostly achieved by the side magnets being bar magnets. The end magnet 194 may be replaced by a magnet or magnetic pole of more complex shape. In the original implementation of the bar magnetron 190, the button magnet has a diameter of 0.625 inch (16 mm), and the bar magnets 192, 194, 196 have widths of 1 inch (25 mm), all magnets producing the same magnetic field per unit area. In a newer version, the width of the bar magnets is being increased to 1.5 inch (38 mm).

Figure 16:
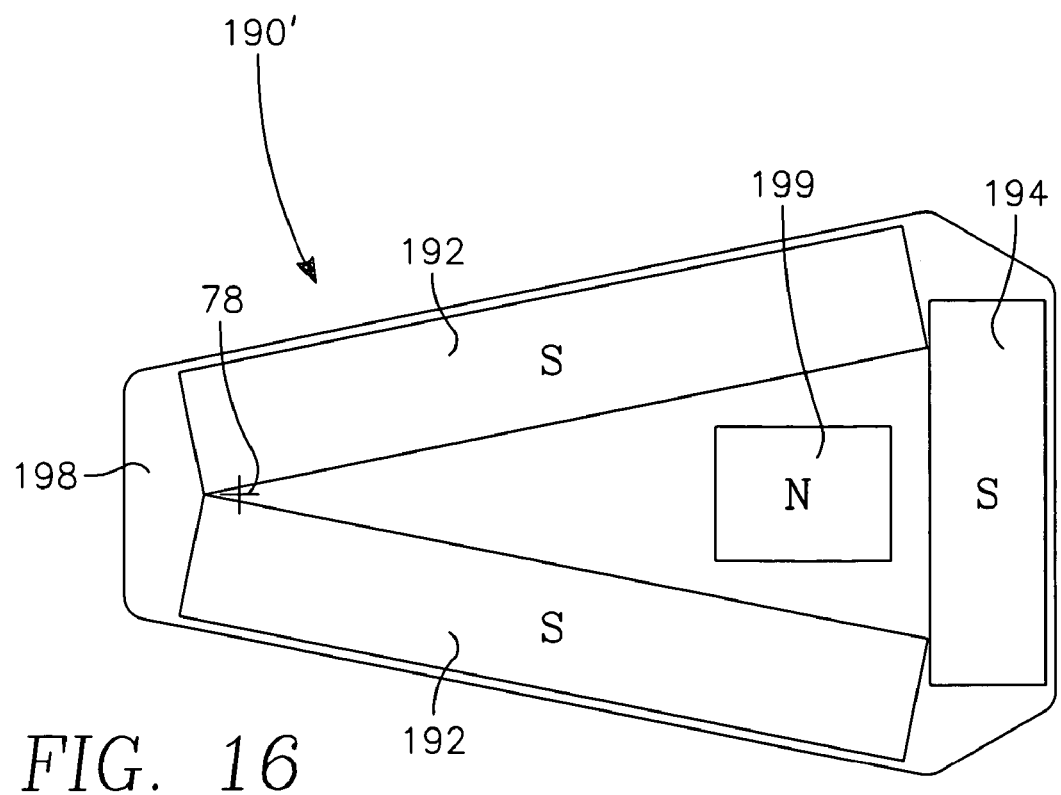
FIG. 16 is a bottom plan view of an alternative to the magnetron of FIG. 15.

In an alternative embodiment of a magnetron 190' illustrated in the bottom plan view of FIG. 16, a rectangular bar magnet 199 is used as the central magnet of the second magnetic polarity. The central magnet can assume a more complex shape, for example, a corresponding but smaller triangular shape or two circular magnets of different diameters so as to better fill the interior of the outer magnets and to make the inter-pole gap more uniform. However, the illustrated configurations have been shown to be quite effective.

It is understood that the shapes described above refer to pole faces having band-like widths of area not significantly larger than the button magnets being used. The widths, particularly of the outer pole face, can be increased, perhaps even non-uniformly, but the additional width is of less effectiveness in generating the desired high magnetic field.

The shapes presented above have all been symmetric about the target radius. However, the magnetron of the invention includes asymmetric shapes, for example one radially extending side being in the form of the racetrack of FIG. 4 and the other side being oval, e.g., the egg shape of FIG. 7, or one radially extending side being oval or straight and the other side having a triangular apex between the center and periphery of the target.

Figure 17:
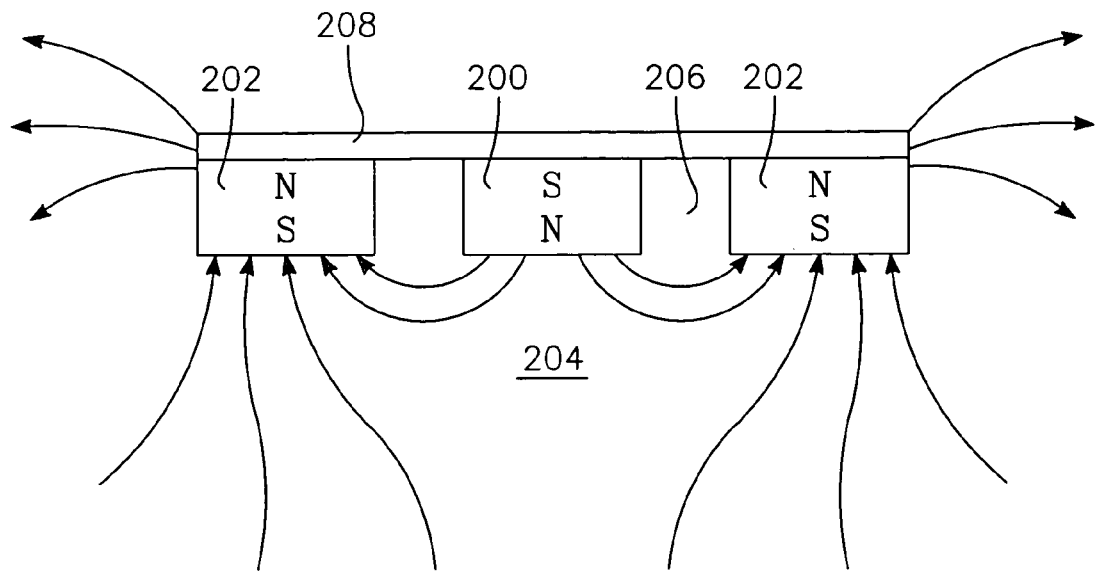
FIG. 17 is a side view of an idealization of the magnetic field produced with the described embodiments of the invention.

All the magnetrons described above have asymmetric areas for the inner and outer poles and, assuming similar packing of similar button magnets 90, 92 or bar magnets of similar magnetic intensities, they produce asymmetric magnetic flux. In particular, the total or integrated magnetic flux ∫B·dS produced by the inner pole 200, illustrated schematically in FIG. 17, is much less than that produced by the surrounding outer pole 202, for example, by at least a factor of 1.5 and preferably 2. All the magnetrons are also characterized as having a compact inner pole 200 surrounded by the outer pole 202. The result is a magnetic field distribution which is very strong in the reactor processing area 204 adjacent to the gap 206 between the poles 200, 202, but which also extends far into the processing area 204 as the magnetic field lines of the outer pole 192 close back to the magnetic yoke 198. The substantial fraction of magnetic field extending vertically from the target deep into the processing area 204 offers many advantages. Because the light electrons orbit around magnetic field lines, the extended magnetic field traps electrons and thus helps to support a higher-density plasma deep into the processing area 204. By the same interaction, the magnetic field extending close and parallel to the grounded chamber shield reduces electron loss to the shield, also increasing the density of the plasma. As a result, the plasma can be supported at lower pressure or even be self-sustained. The magnetic field also partially traps heavier positive particles and thus guides ionized sputtered particles towards the wafer.

The inventive magnet also achieves a relatively high magnetic field. However, magnetic field intensity of itself is insufficient. Some conventional magnetrons, such as Demaray et al. disclose in the aforecited patent, use a line of horseshoe magnets arranged in a kidney-shaped linear path with only a small gap between the poles of the horseshoes. As a result, a relatively high magnetic field intensity can be achieved in the area at the periphery of the kidney shape. However, the linear shape of the high magnetic field surrounds an area of substantially no magnetic field. As a result, electrons can escape to not only the exterior but also the interior of the high-field region. In contrast, the inner pole of the triangular magnetron of the invention produces a magnetic cusp of minimal area. If electrons are lost from the magnetic field on one side of the inner pole, they are likely to be captured on the other side, thus increasing the plasma density for a given power level. Furthermore, the inner pole includes a single magnetizable pole face producing a generally uniform magnetic flux. If multiple inner poles faces were used for multiple inner magnets, magnetic field lines would extend to between the inner magnets.

A further advantage of the inventive design is that one pole is formed in a closed line and surrounds the other pole. It would be possible to form a very small linearly extending magnetron with high magnetic field intensity by arranging horseshoe magnets or the like in an open ended line with the two sets of poles being closely spaced. However, the electrons could then easily escape from the open ends and decrease the density of the plasma.

It is believed that the beneficial results of the invention are achieved in large part because the oval magnetrons and magnetrons of related shapes produce a higher plasma ionization density without requiring excessive power. Nonetheless, full target coverage is achieved. In one aspect, the inventive magnetron has a relatively small area, but has a shape that allows full target coverage without radial scanning. The triangular magnetron 160 of FIG. 10 with an apex angle of 60° has an area of ⅙ (0.166) of the usable target area. In contrast, if the circular magnetron 162 were used, which similarly extends from the target center to the periphery, the magnetron area is ¼ (0.25) of the target area. As a result, the power density is less for a given power supply powering a larger circular magnetron. The target overlay percentage is even higher for the Tepman magnet of FIG. 3.

The combination of small area and full coverage is achieved by an outer magnetron shape extending from the target center to its usable periphery (±15%) and having a transverse dimension at half the target radius of less substantially less than the target radius, that is, prolate along the target radius. The transverse dimension should be measured circumferentially along the rotation path.

The uniformity is enhanced by an oval shape that is transversely wider, with respect to the target radius, at its outer end near the target periphery than at its inner end near the center of rotation. That is, the minor axis is displaced towards the target circumference.

The small area of the magnetron, but nonetheless providing full target coverage, allows a very high power density to be applied to the target with a reasonably sized power supply. The small area, unlike the Tepman design, has no substantial field-free region included in its interior. Some of the examples below use an 18 kW power source. For a 200 mm wafer, the magnetron extends out to a usable target diameter of about 300 mm. The effective area of the arced triangular magnetron is about one-sixth of the area associated with this larger diameter, that is, about 117 cm². Thus, the average power density of the area being sputtered at any given location of the magnetron is about 150 W/cm². Such a high power density achieved without inductive coils can support a plasma at lower argon pressure or permit sustained self-sputtering for selected metals such as copper. Even with 300 mm wafers, a 27 kW power supply in conjunction with the small magnetron of the invention scaled to the larger dimension will produce a target power density of 103 W/cm². As shown below, a power density of 76 W/cm² is sufficient for sustained self-sputtering of copper.

Wave-Beam Interaction

The magnetrons of the type described above produce an unexpectedly high metal ionization fraction, on the order of 10 to 20%. While this is below the 50 to 70% metal ionization fraction experienced in inductively coupled IMP reactors, it is still substantially higher than the less than 5% metal ionization fraction usually experienced in DC magnetron reactors. Experiments have shown that the above described magnetrons can excite several plasma waves, and it is believed that these waves increase the energy of the plasma electrons and the increased electron energy significantly increases the ionization of the sputtered metal atoms. It is known that relatively small increases in the electron energy (temperature) significantly increases plasma densities.

Figure 18:
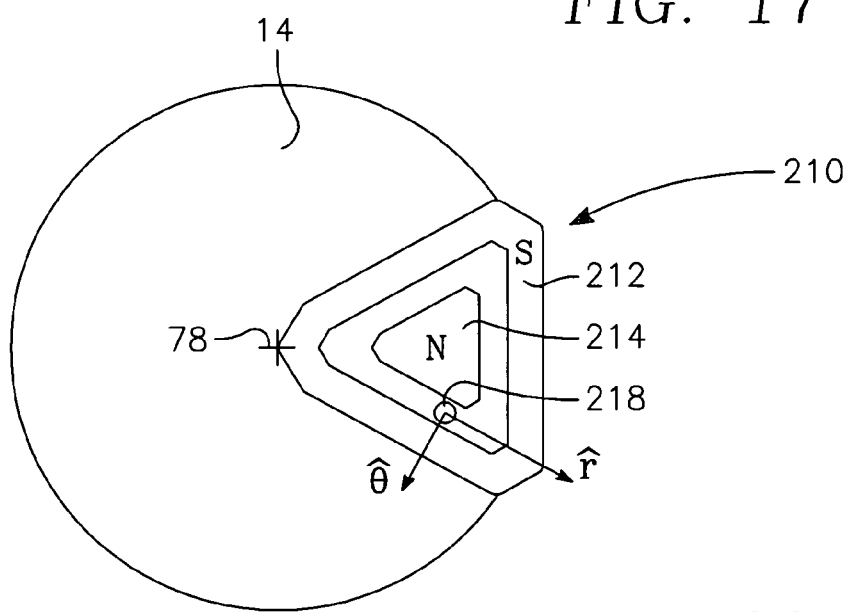
FIGS. 18 and 19 are a top plan view and a schematic side view of a chamber and magnetron arranged for measuring plasma wave generated by a magnetron of the invention.
Figure 19:
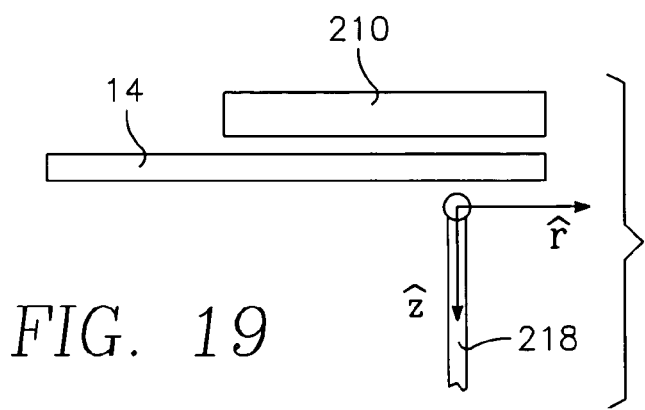

A series of experiments were performed using a triangular magnetron 210 illustrated in the plan view of FIG. 18 and the side view of FIG. 19 including a generally triangular outer pole 212 surrounding an inner pole 214 of the opposite magnetic polarity. The magnetron 210 is placed behind a 1.2 cm-thick planar target 14 of titanium sealed to the otherwise conventional sputter reactor of FIG. 1. However, the magnetron 210 is not rotated during the tests, and various probes 218 are inserted from the below with the probe tip located about 1 cm below the target 14 at a position between the magnetron poles 212, 214 at about two-thirds of the target radius. Typical chamber operating conditions used during the tests are an argon gas pressure of 1.6 milliTorr and 2 kW of DC target power producing a target voltage of 455VDC.

A spectrum analyzer having a floating cylindrical Langmuir probe as the probe reveals a double-peaked feature at about 240 MHz and 262 MHz and a broad feature at about 22 MHz. It is our interpretation, although the invention is not limited to our understanding of the invention, that the 262 MHz peak is a lower-hybrid peak $\omega_{LH}$ and that the other two peaks are produced by a non-linear parametric conversion in which the 22 MHz peak has an energy $\omega_B$ and the 240 MHz sideband peak has an energy $\omega_{LH}-\omega_B$. In a parametric conversion, the wave vector is also conserved so that wave vectors for the 22 and 240 MHz peak should be related as $k_B$ and $k_{LH}-k_B$.

A further discussion of this interpretation requires some definitions. A plasma has two plasma frequencies associated with the electrons and the ions. In each case, the plasma frequency $\omega_P$ can be expressed as $$\omega_P^2 = \frac{4e^2n}{m},$$

where e is the charge which is of unit value for both electrons and most plasma ions, $n_P$ is the plasma density, and m is the mass of the electron or ion. The plasma also has two cyclotron frequencies $\omega_C$, which can be expressed as $$\omega_C = \frac{eB}{mc},$$

where B is the magnetic field and c is the speed of light. We estimate that the electron plasma frequency is about 3 GHz; the electron cyclotron frequency, about 1 GHz; and the ion plasma frequency, about 11 MHz.

Matsuoka et al. have disclosed observing a plasma wave in "Dense plasma production and film deposition by new high-rate sputtering using an electric mirror," *Journal of Vacuum Science and Technology A*, vol. 7, no. 4, July/August 1989, pp. 2652–57. However, they attributed the primary plasma wave to the upper hybrid mode $\omega_{UH}$, which can be represented by $$\omega_{UH} = \sqrt{\omega_{P,e}^2 + \omega_{C,e}^2}.$$

This would be too high a frequency to match the observed spectrum. Instead, we believe the 262 MHz peak is associated with the lower hybrid mode $\omega_{LH}$ which is defined as $$\omega_{LH} = \frac{\omega_{P,e}}{\sqrt{1+\frac{\omega_{P,e}^2}{\omega_{C,e}^2}}}.$$

Lower hybrid modes can exist with frequencies in the range of $\omega_{C,i} < \omega < \omega_{C,e}$, $\omega_{P,e}$.

We believe that the peak at 22 MHz is associated with a lower hybrid ion quasi mode that is associated with the plasma being over driven with the large amounts of power being applied to it.

Figure 20:
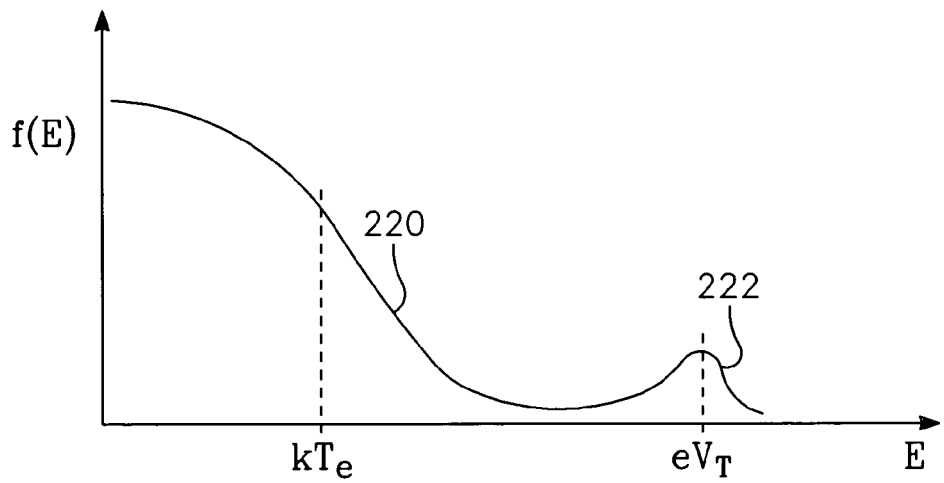
FIG. 20 is a graph of a typical energy distribution of plasma electrons.

The plasma waves at 240 MHz and 262 MHz, whatever their source, do not provide much heating of the electrons. As illustrated in the graph of FIG. 20, plasma electrons have a generally maxwellian energy distribution 220 with an average energy <E> defining an electron temperature $T_e$. Electron temperatures in practical sputtering plasmas have been reported in the range of 3 eV to over 20 eV. The energy distribution 220 has a high sub-peak 222 associated with the secondary electrons crossing the plasma sheath with an energy generally associated with the target voltage $V_T$, which for our experiments is 455V.

An advantage of the parametric power conversion believed responsible for generating the 22 MHz mode is that the higher-frequency modes, such as the 240 MHz one, are more typical in plasma reactors, but its power is converted to a lower-frequency mode at less than 20% of the original frequency which is more suitable to interact with the thermalized bulk electrons.

The wave vectors k of the upper two peaks were measured using a digital oscilloscope having two probes 208 separated by $\Delta x=0.6$ cm in the respective r, θ, z directions illustrated in FIGS. 18 and 19. The wave vector component $k_x$ is calculated to be $\Delta\phi/\Delta x$, where $\Delta\phi$ is the measured phase difference between the probes. The wave vector k for the 262 MHz peak can be represent in units of cm$^{-1}$ as $$\vec{k} = 3.9\hat{r} + 6.3\hat{\theta} + 0.5\hat{z},$$

which has a magnitude k of about 7.4 cm$^{-1}$. The difference in wave vectors between the 240 MHz and the 262 MHz peak has been measured to have a magnitude |Δk| of approximately 2 cm$^{-1}$. The error bars on most of these measured values are large, but no more than 50%.

The magnetic field vector B has been measured at a point between the probes can be expressed in units of gauss as $$\vec{B} = 150\hat{r} + 450\hat{\theta} + 35\hat{z},$$

which has a magnitude of 475 gauss. The angle between the wave vector k and the magnetic field B is equal to the ratio between the perpendicular and parallel wave vectors $k\perp/k\|$, which is measured to be in the range of 0.5 to 0.75.

The phase velocity $v_p$ for a wave is given by $$v_p = \frac{\omega}{|k|}.$$

For the 262 MHz peak, the phase velocity is thus calculated from the measured wave vector as $2 \times 10^8$ cm/s based on the above measurement of its wave vector. This is to be compared with a velocity of $1 \times 10^9$ cm$^{-1}$ for the 455 eV injected secondary electrons. That is, the freshly injected secondary electrons could easily drive the measured 262 MHz plasma wave. However, the phase velocity of the 262 MHz peak is entirely too high to effectively interact with the bulk of the thermalized electrons.

The wave vector for the 22 MHz radiation could not be adequately measured directly. However, assuming a parametric process, the wave vector difference between the 262 MHz and the 240 MHz modes (measured as 2 cm$^{-1}$) should equal the wave vector of the 22 MHz mode. If this is true, the phase velocity of the 22 MHz mode is approximately $6 \times 10^7$ cm/s, which corresponds to a 10 eV electron. That is, the 22 MHz mode is well matched to couple energy into the thermalized plasma electrons, thereby increasing the average electron energy. We believe the coupling from the plasma wave to the electrons is through Landau damping.

The conditions permitting the launching of the lower hybrid mode and its parametric conversion to another mode capable of coupling to the thermalized electrons depend greatly on the magnetic configuration and strength associated with the magnetrons. The magnetrons and planar target described for this invention appear to satisfy the conditions. Other magnetrons have been tested with planar targets, but no plasma waves are observed. Apparently, the electron mirror configuration of the complexly shaped target of Matsuoka et al. fails to launch the lower hybrid mode, and they fail to report any wave lower than about 100 MHz. In view of our experience and the apparent phase velocity of the 22 MHz mode, it seems necessary that a plasma mode be excited between 5 and 75 MHz, preferably between 10 and 50 MHz, in order to pump the 1 to 20 eV plasma electrons. The launching of any plasma waves seems to depend upon a magnetic field projecting far away from the target. Matsuoka et al. accomplish this by a complex hollow cathode design. The present invention accomplishes this by the unbalanced magnetic field strengths of the two poles of the magnetron, which produces a vertical magnetic field far away from the target, as well as by driving the reactor at a high power level.

Another condition for launching a plasma wave is that the beam density of the secondary electrons emitted from the target needs to exceed a threshold. That is, the power density applied to the target must be high. The inventive magnetron reduces the magnetron area and hence allows an increased power density achievable by a given power supply while still maintaining sputtering uniformity. Nonetheless, high target power is required for a commercially sized sputter readctor.

Processes

A racetrack magnetron of FIGS. 4 and 5 was tested with copper sputtering. In one configuration, six magnets 90 are placed behind the center pole face 62, twenty-five magnets of the same strength but opposite polarity are arranged behind and around the outer pole face 68, and the spacing between the 33 cm target and the 200 mm wafer is 190 mm. This configuration produces a deposition uniformity of ±18%. In a second configuration, the magnets have different strengths, the stronger ones producing 30% more magnetic flux. Six strong magnets are placed behind the center pole face, and 25 weaker magnets are placed around the outer pole face. Despite the stronger inner magnets, the total magnetic flux produced by the outer magnets is greater than that produced by the inner ones. The second configuration produces an improved deposition uniformity of 8.9%. The second configuration also produces superior hole filling into a 0.5 µm-wide, 2 µm-deep via hole. For 265 nm of blanket copper, the bottom coverage is between 10 and 15%, and the sidewall coverage is about 2.8%. The deep hole filling is promoted by the small area of the racetrack magnetron producing a higher ionization density. In a third configuration, strong magnets replace some of the weaker magnets near the ends of the outer pole. This produces a somewhat better uniformity.

An arced triangular magnetron of FIGS. 10 and 11 was tested in a series of experiments with different sputtering composition. For almost all the experiments, the target was spaced between 190 and 200 mm from the wafer and the target had a diameter of 330 mm for a 200 mm wafer.

Copper

For copper sputtering, uniformity is improved by using ten strong magnets 160 in the inner pole, strong magnets 162 along the arc portion 150 of the outer pole, and weaker magnets 164 for the remainder of the outer pole. The stronger magnets have a diameter 30% larger than the diameter of the weaker magnets, but are otherwise of similar composition and structure, thereby creating an integrated magnetic flux that is 70% larger.

Sustained self-sputtering of copper is achieved, after striking the plasma in an argon ambient, with 9 kW of DC power applied to the target having a usable diameter of about 30 cm, which results in a power density of 76 W/cm$^2$ with the arced triangular magnetron. However, it is considered desirable to operate with 18 kW of DC power and with a minimal argon pressure of about 0.1 milliTorr arising at least in part from leakage of the gas providing backside cooling of the wafer to the liquid-chilled pedestal. The increased background pressure of 0.1 to 0.3 milliTorr enhances effective wafer cooling without significant increase in the scattering and deionization of the sputtered ions. These relatively low DC powers are important in view of the ongoing development of equipment for 300 mm wafers, for which these numbers scale to 20 kW and 40 kW. A power supply of greater than 40 kW is considered expensive if not infeasible.

One application of ionized copper sputtering is to deposit a thin conformal seed layer of copper in a deep and narrow via hole. Thereafter, electro or electroless plating can be used to quickly and economically fill the remainder of the hole with copper.

In one experiment, a via hole having a top width of 0.30 μm and extending through 1.2 μm of silica was first coated with a Ta/TaN barrier layer. Using the arced triangular magnetron, copper was deposited over the barrier layer at 18 kW of target power and a pressure of 0.2 milliTorr. The deposition was carried out to a blanket thickness of about 0.15 μm. The sides of the via hole was smoothly covered. The experiments show that the sidewall thickness of the copper is about 7 nm on one side and 11.4 nm on the other side (5% and 8%) for a via located at the wafer edge. The bottom coverage is about 24 nm (16%). Sidewall symmetry is improved for a via hole at the wafer center. The smoothness promotes the use of the deposited layer as a seed layer and as an electrode for subsequent electroplating of copper. The relatively good symmetry between the two sidewalls relieves the problem in the prior art of apparently moving photolithographic indicia.

Aluminum

Using the arced triangular magnetron, sputtering of an aluminum target was achieved at both 12 kW and 18 kW of applied power with a minimum pressure of about 0.1 milliTorr, a significant improvement. For aluminum sputtering, sidewall coverage and particularly bottom coverage is significantly improved. The better uniformity is also believed to be related in part to the increased ionization fraction since the self-biased pedestal supporting the wafer attracts the ionized sputtered particles across its entire area. It is estimated that the magnetron of the invention increases the ionization fraction from 2% to at least 20% and probably 25%.

Figure 3:
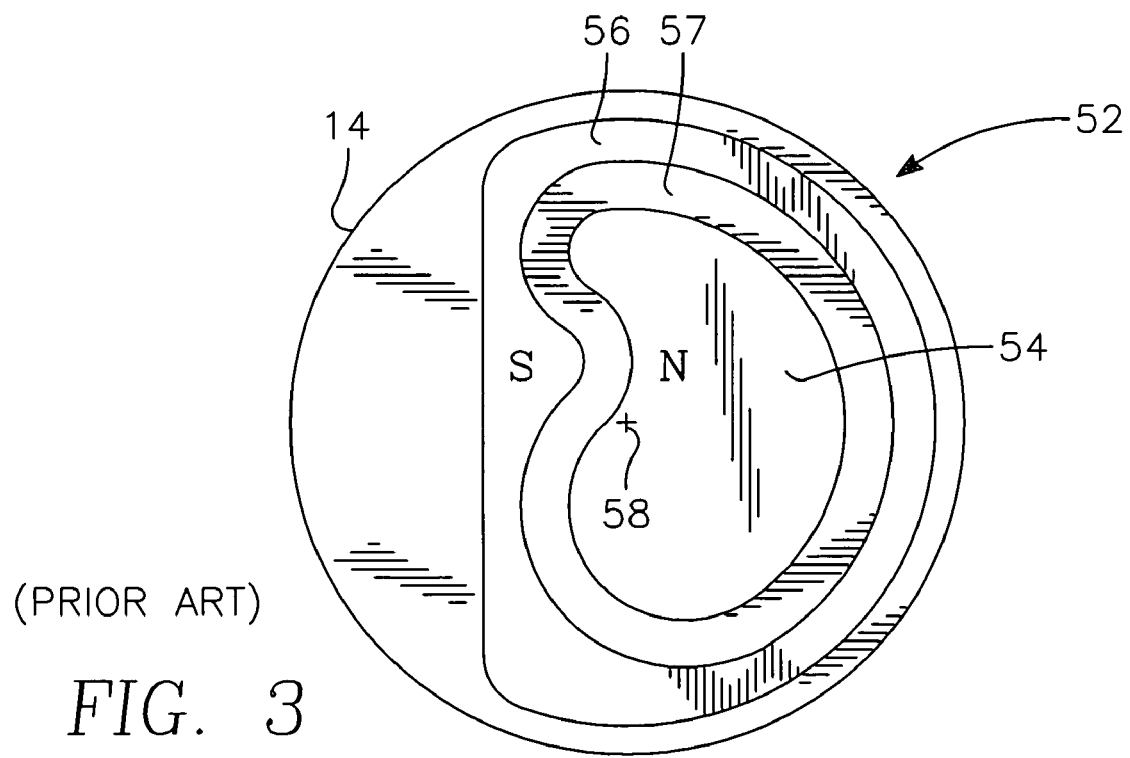
FIG. 3 is a plan view of a conventional magnetron.

The arced triangular magnetron was compared under similar operating conditions to the operation of a conventional magnetron resembling the Tepman magnetron of FIG. 3. The comparative results are summarized in TABLE 1 for the sputtering of aluminum.

TABLE 1

|  | Triangle | Conv. |
| --- | --- | --- |
| Bottom Coverage | 28.5% | 8.0% |
| Sidewall Coverage | 8.0% | 5.7% |
| Uniformity (190 mm) | 4.6% | 7.8% |
| Uniformity (290 mm) | 3.0% | 6.0% |
| Minimum Pressure (milliTorr) | 0.1 | 0.35 |

The coverage results were obtained for via holes having a width of 0.25 μm and a depth of 1.2 μm, that is, an aspect ratio of about 5. The bottom coverage is significantly improved with the inventive triangular magnetron compared to the conventional magnetron. The sidewall coverage is also increased, and further the coverage is smooth and uniform from top to bottom. These two characteristics promote the use of the deposited metal layer as a seed layer for a subsequent deposition step. This is particularly important for copper in which the second deposition is performed by a different process such as electroplating. The increased bottom and sidewall coverages are believed to be due to the higher ionization fraction of sputtered aluminum atoms achieved with the inventive triangular magnetron. This ionization fraction is believed to be 25% or greater. The uniformity of blanket (planar) deposition was determined both for a separation of 190 mm between the target and the wafer and, in a long-throw implementation, for a separation of 290 mm. The inventive triangular magnetron produces better uniformity, especially for long throw. The better uniformity is also believed to be related to the increased ionization fraction since the self-biased pedestal supporting the wafer attracts the ionized sputtered particles across its entire area. Similarly, the inventive triangular magnetron produces less asymmetry between the coverages of the two opposed sidewalls. The increased ionization density is due in part to the relatively small inner yoke having an area substantially less than that of the outer yoke. As a result, electrons lost from one side of the inner yoke are likely to be captured by the other side.

The bar magnetron of FIG. 15 has been demonstrated for sputtering copper. It shows improved bottom coverage and sidewall coverage near the bottom. Overall, it produces a seed layer of reduced thickness that still allows effective hole filling of copper by electrochemical plating.

All of these advantages are obtainable in a conventional capacitively coupled DC sputter reactor using a magnetron of fairly simple design. Of course, the magnetron of the invention can also be advantageously used in other types of sputter reactors, such as an HDP reactor relying upon inductively coupled RF power.

Titanium

The arced triangular magnetron was also used to sputter titanium. Titanium, sometimes in conjunction with titanium nitride, is useful in aluminum metallization for providing a silicided contact to silicon at the bottom of a contact hole and to act as wetting layer and in conjunction with a titanium nitride layer as a barrier both to the silicon in a contact hole and between the aluminum and the silica dielectric on the via or contact sidewalls. Conformal and relatively thick coatings are thus required.

A series of experiments were performed using a titanium target with 18 kW of DC target power and with only six magnets 160 in the inner pole. At a chamber pressure of 0.35 milliTorr, the bottom coverage and uniformity are observed to be good.

Figure 21:
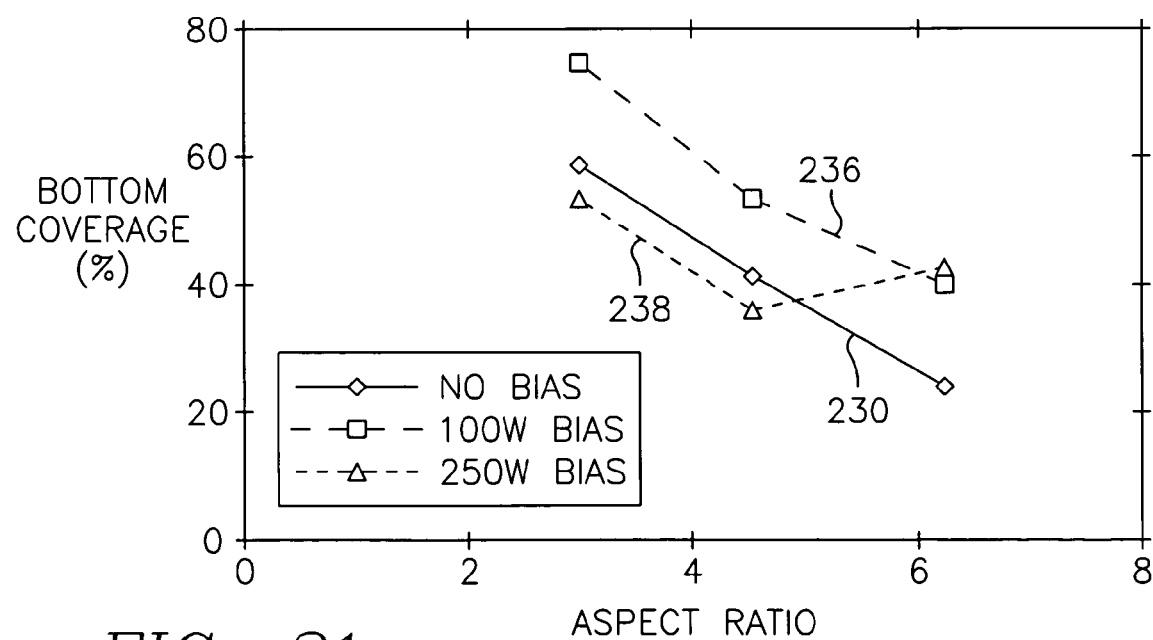
FIG. 21 is a graph showing the effect of RF wafer bias in bottom coverage in titanium sputtering.
Figure 22:
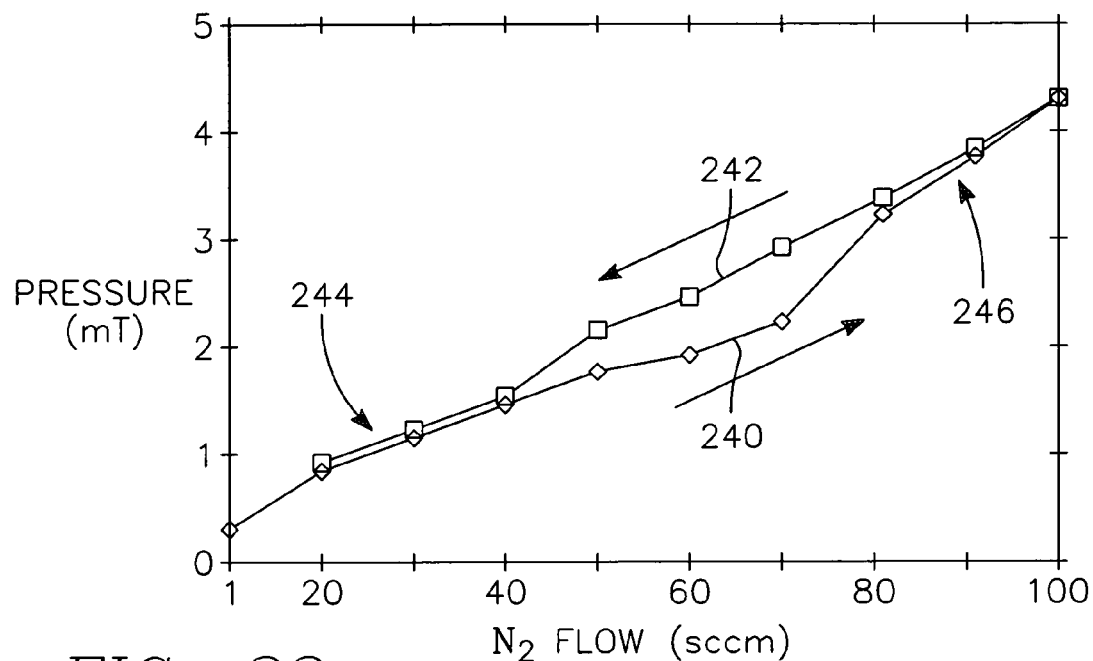
FIG. 22 is a graph of the dependence of chamber pressure upon nitrogen flow illustrating the two modes of deposition obtained in reactive sputtering of titanium nitride with a magnetron of the invention.

The titanium experiments were continued to measure bottom coverage as a function of the aspect ratio (AR) of the via hole being coated. With no wafer bias applied and the pedestal heater 18 left electrically floating, the 18 kW of target power nonetheless self-biases the target to about 30 to 45V. The bottom coverage under these conditions is shown by line 230 in the graph of FIG. 21. The bottom coverage decreases for holes of higher aspect ratios but is still an acceptable 20% at AR=6.

Figure 1:
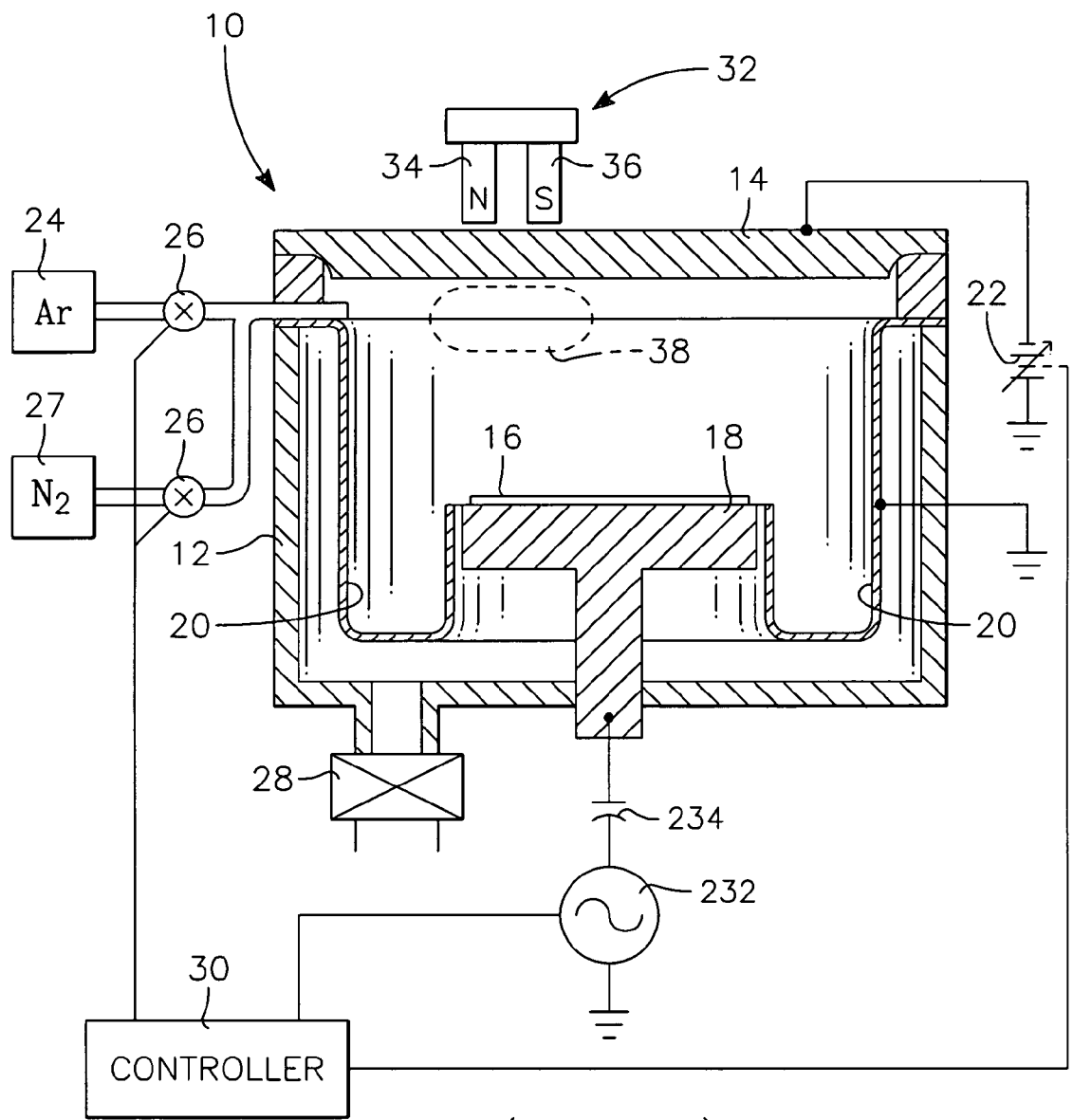
FIG. 1 is a schematic diagram of a DC plasma sputtering reactor.
Figure 2:
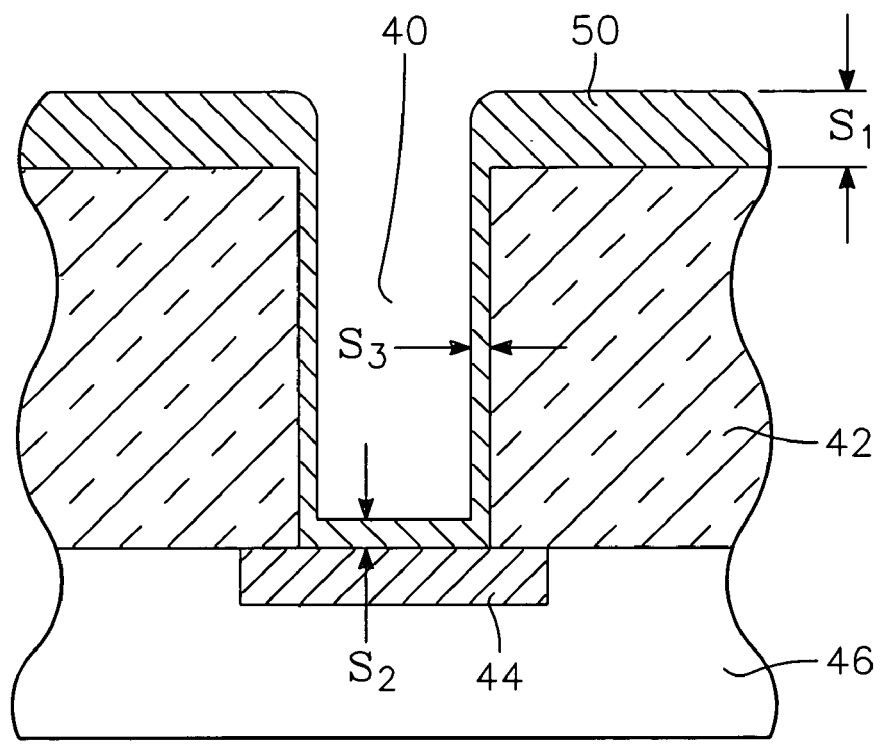
FIG. 2 is a cross-sectional view of a inter-level via in a semiconductor integrated circuit.

In a continuation of these experiments, an RF power source 232, illustrated in FIG. 1, was connected to the heater pedestal 18 through a capacitive coupling circuit 234. It is known that such an RF field applied to the wafer adjacent to a plasma creates a DC self-bias. When 100 W of 400 kHz power is applied with a chamber pressure of 0.3 milliTorr, the bottom coverage is significantly increased, as shown by line 236 in the graph of FIG. 21. However, when the bias power is increased to 250 W, resputtering and faceting of the top corners of the via hole becomes a problem. The bottom coverage results for 250 W bias are shown by line 238. For aspect ratios above 4.5, the bottom coverage with 250 W of wafer bias is generally worse than for 100 W of wafer bias so bias powers should be kept below 250 W for lower bias frequencies of 2 MHz or less. These powers should be normalized to a 200 mm circular reference wafer. Other sizes of wafers, such as a 300 mm wafer can be used, and these wafers may not be completely circularly because of indexing flats or notches. However, the same effects are expected when the power levels quoted above are referenced to a 200 mm circular reference wafer and then scaled according to the differing area of a substantially circular working wafer.

The experiments were continued for holes with aspect ratios of 4.5 using 300 W of RF wafer bias at a frequency of 13.56 MHz. At a pressure of 0.7 milliTorr, the blanket deposition rate is 128 nm/min, and the bottom coverage varies between 31% and 52%. At a pressure of 1.4 milliTorr, the deposition rate is 142 nm/min, and the bottom coverage varies between 42% and 62%. At the higher pressure, the sidewall coverage varies between 10.4% and 11.5%, and no appreciable sidewall asymmetry is observed. Contrary to expectations, pressures above 0.7 milliTorr produce higher titanium deposition rates and better bottom coverage. The higher bias frequency permits a higher bias power to be applied.

Titanium Nitride

The magnetron of the invention can also be used for reactive sputtering, such as for TiN, in which nitrogen is additionally admitted into the chamber to react with the sputtered metal, for example, with titanium to produce TiN or with tantalum to produce TaN. Reactive sputtering presents a more complex and varied chemistry. Reactive sputtering to produce TiN is known to operate in two modes, metallic mode and poison mode. Metallic mode produces a high-density, gold-colored film on the wafer. Poison mode, which is often associated with a high nitrogen flow, produces a purple/brown film which advantageously has low stress. However, the poison-mode film has many grain boundaries, and film defects severely reduce chip yield. Furthermore, the deposition rate in poison mode is typically only one-quarter of the rate in metallic mode. It is generally believed that in poison mode the nitrogen reacts with the target to form a TiN surface on the Ti target while in metallic mode the target surface remains clean and TiN forms only on the wafer.

The arced triangular magnetron was tested for reactive sputtering of titanium nitride in the same chamber used for sputter depositing titanium.

The initialization conditions for sputter depositing titanium nitride are found to be very important to obtain operation in the metallic mode. In a series of initial experiments, argon alone is first admitted to the chamber. After the plasma is struck at an argon pressure of about 0.5 milliTorr, the argon flow is reduced to 5 sccm producing a pressure of 0.3 milliTorr. When the nitrogen flow is then step wise ramped up to 100 sccm and then is gradually reduced, the dependence of the chamber pressure upon the flow assumes a hysteretic form illustrated in FIG. 18. Between about 50 and 70 sccm of nitrogen, intermediate ramp-up pressures 240 are below corresponding intermediate ramp-down pressures 242. At lower pressures 244 and at higher pressures 246, there is no significant separation between ramp up and ramp down. It is believed that the lower pressures 244 and intermediate ramp-up pressures 240 cause sputtering in metallic mode while higher pressures 246 and intermediate ramp-down pressures 242 cause sputtering in poison mode.

These results show that, for higher operational deposition rates in the generally preferred metallic mode, it is important to not exceed the intermediate ramp-up pressures 240, that is, not to exceed the maximum metallic-mode flow, which in these experiments is 70 sccm or slightly higher but definitely below 80 sccm. The argon and nitrogen can be simultaneously and quickly turned on, but preferably the DC power is also quickly turned on.

There are some applications, however, where operation in poison mode is preferred. This can be achieved by first going to the higher pressures 246 and then decreasing to the ramp-down intermediate pressures 242. Alternatively, poison mode can be achieved by immediately turning on the desired gas flow, but only gradually turning on the DC sputtering power supply at a rate of no more than 5 kW/s.

Figure 23:
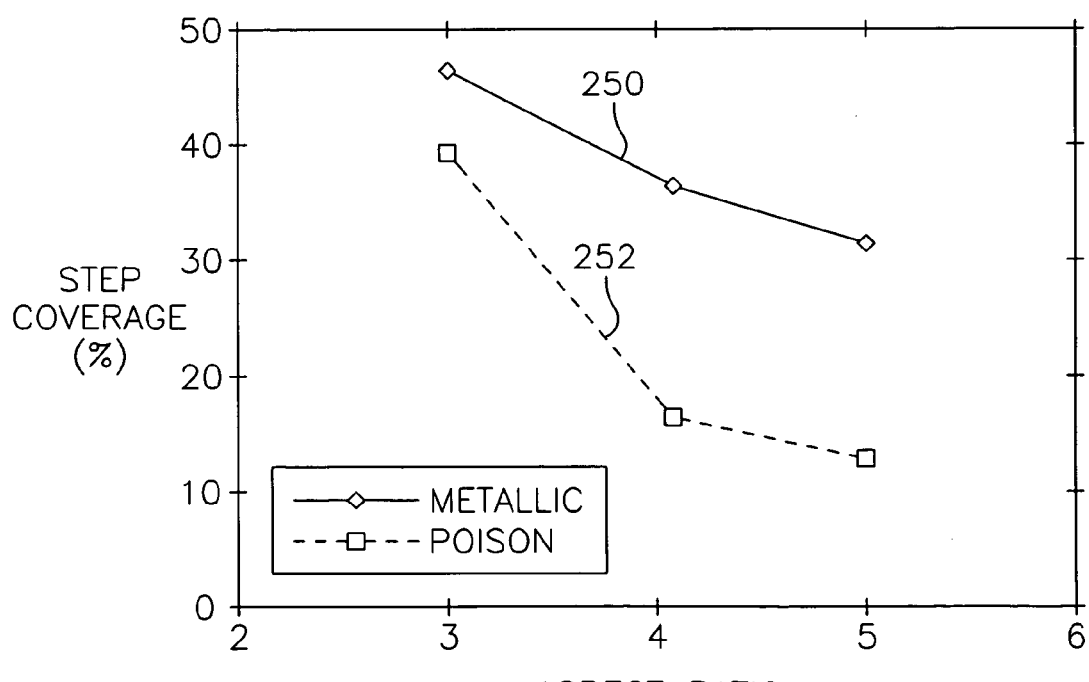
FIG. 23 is a graph of the step coverage obtained in the two sputtering modes for reactive sputtering of titanium nitride with a magnetron of the invention.

Titanium nitride was sputtered into high aspect-ratio via holes in both metallic and poison modes at a $N_2$ flow of 50 sccm and an Ar flow of 5 sccm after the plasma had been struck in argon. These flows produce a pressure of 1.7 milliTorr in metallic mode and 2.1 milliTorr in poison mode. The deposition rates are 100 nm/min in metallic mode and 30 nm/min in poison mode. On one hand, the TiN film stress is higher when it is deposited in metallic mode, but on the other hand poison mode suffers from overhang and undulatory sidewall thicknesses near the top of the via hole. A series of experiments deposited TiN into via holes of differing aspect ratios. The resulting measured bottom coverage, illustrated in the graph of FIG. 23, shows in line 250 that bottom coverage in metallic mode remains relatively high even with an via aspect ratio of 5 while in line 252 the step coverage in poison mode is always lower and drops dramatically for aspect ratios of four and higher. However, when additionally the wafer is biased, step coverage of TiN deposited in the poison mode is acceptable.

The success of depositing TiN in the same chamber used for depositing Ti demonstrates that the Ti/TiN barrier can be deposited according to the invention in one continuous operation.

Integrated Tungsten Plug Process

Two series of tests were performed to demonstrate an integrated process combining the Ti/TiN barrier deposited with the arced magnetron of the invention and a tungsten plug deposited by chemical vapor deposition (CVD) into the barrier-coated hole. This combination has presented some problems in the past because tungsten CVD typically uses tungsten hexafluoride ($WF_6$) as the gaseous precursor. $WF_6$ tends to attack Ti and to result in structures formed in the W plug resembling volcanoes, which produces voids in the plug.

In the first series of tests, the barrier layer consisted of 30 nm of Ti covered by 30 nm of TiN deposited with the arced magnetron of the invention in an otherwise conventional non-inductive sputter reactor. Following the Ti/TiN deposition, the chip was subjected to rapid thermal processing (RTP) in which intense radiant lamps quickly heat the wafer surface for a short period. In the second series of tests, the barrier layer consisted of 30 nm of Ti covered by 10 nm of TiN deposited as in the first series. However, in the second test, before the Ti/TiN deposition the wafer was subjected to a plasma preclean, but there was no RTP afterwards. In either case, tungsten was then CVD deposited over the Ti/TiN.

These experiments show that neither process produces volcanoes. Furthermore, thickness and resistivity of the TiN show good uniformity. The TiN resistivity is measured to be less than 45 μΩ-cm. Bottom coverage of 20% for the TiN/Ti bilayer is observed in holes having aspect ratios of 5:1 without the use of wafer biasing. Wafer biasing produces the same bottom coverage in holes having aspect ratios of 10:1. Thus, the Ti/TiN process performed with the magnetron of the invention can be successfully integrated into a tungsten plug process. The inventive magnetron can also be used to sputter deposit other materials, for example, W, using a tungsten target, or TaN, using a tantalum target and nitrogen gas in the plasma. Reactive sputtering of WN is also contemplated.

The magnetron of the invention is thus efficient in producing a high ionization fraction because of the high-density plasma it can create without excessive power being required. Nonetheless, its full coverage allows for uniform deposition and full target utilization. Its sputtering uniformity is good. Nonetheless, no complex mechanisms are required.

The effectiveness of the magnetron of the invention in providing high-performance full-coverage sputtering is based on three interrelated synergetic effects. The magnetron has a small magnetic area. Thereby, the average magnetic field can be made high, and the plasma losses reduced. The small magnetron also allows a high average power density to be applied to the area of the target beneath the magnetron. That is, although the electrical power applied to the target as a whole is relatively modest, the electrical power density and resulting plasma density in the area actually being sputtered at any instant is high. The asymmetry of the inner and outer magnetic poles of the magnetron produces portions of the magnetic field extending vertically surrounding the periphery of the magnetron and extending far into the chamber. This magnetic field distribution reduces plasma losses and guides ionized sputtered particles to the substrate. All of these advantages are enjoyed in a magnetron providing full coverage sputtering of the target with only circumferential scanning, and in a magnetron that can be optimally shaped to produce uniform target sputtering and uniform substrate deposition.

Such a small, high-field magnet enables sustained self-sputtering with relatively modest target power and also enables sputtering of materials such as aluminum and titanium at reduced pressures below 0.5 milliTorr, preferably below 0.2 milliTorr, and even at 0.1 milliTorr. At these pressures, deep hole filling can be facilitated by the reduced scattering of sputtered particles, whether neutral or ionized, and by the reduced neutralization of ionized particles. However, at least for titanium, it has been found that with the use of the magnetron of the invention, deposition rate and bottom coverage are improved with working gas pressures above 0.7 milliTorr. The high-field magnet further promotes a high ionization fraction, which can be drawn into a deep, narrow hole by biasing of the wafer within proper ranges.

The invention claimed is:

1. A method of sputtering material from a target comprising a metal onto a working planar substrate supported on a pedestal in a system including a magnetron disposed on a side of said target opposite said pedestal along a central axis of said target, said pedestal, and a vacuum chamber containing said pedestal, asymmetrically placed with respect to the central axis, and including an outer pole having a first magnetic polarity and a first total magnetic flux and an inner pole surrounded by said outer pole, totally displaced away from said central axis on one side thereof, and having a second magnetic polarity opposite said first magnetic polarity and a second total magnetic flux, wherein said first total magnetic flux is larger than said second total magnetic flux by a factor of at least 1.5, said method comprising the steps of:

rotating said magnetron about said central axis;
admitting a working gas into said vacuum chamber;
biasing the pedestal to create a negative voltage thereon; and
applying DC power to said target to excite said working gas into a plasma to thereby sputter said metal of said target onto said substrate.

2. The method of claim 1, wherein said metal is tantalum.
3. The method of claim 1, wherein said metal is titanium.
4. The method of claim 1, wherein said metal is tungsten.
5. The method of claim 1, further comprising admitting gaseous nitrogen into said vacuum chamber, wherein a nitride of said metal is formed on said substrate.
6. The method of claim 5, wherein said metal is tantalum.
7. The method of claim 5, wherein said metal is titanium.
8. The method of claim 5, wherein said metal is tungsten.
9. The method of claim 1, wherein said factor is at least 2.0.
10. The method of claim 1, wherein an area within a periphery of said magnetron is no more than ⅙ of a usable area of said target.
11. The method of claim 1, wherein the biasing comprises RF biasing said pedestal.
12. The method of claim 1, wherein said central axis is located outside of a periphery of the outer pole.
13. A tantalum sputtering method performed in a plasma sputter reactor having a tantalum target disposed on one side of a vacuum chamber and arranged about a central axis, comprising the steps of:

supporting a planar substrate to be sputter coated on a pedestal electrode arranged opposite said target along said central axis;
rotating a magnetron asymmetrically placed about the central axis and disposed on a side of said target opposite said pedestal about said central axis, said magnetron including an inner pole of a first magnetic polarity, completely displaced away from the central axis on one side thereof, and having a first total magnetic flux and an outer pole of a second magnetic polarity opposite said first magnetic polarity, having a second total magnetic flux greater than said first total magnetic flux by a factor of at least 1.5, and surrounding said first magnetic pole;
admitting argon into said vacuum chamber;
applying negative DC power to said target to excite said argon into a plasma to sputter said target; and
RF biasing said pedestal electrode to induce a negative DC self-bias thereupon.

14. The method of claim 13, wherein said factor is at least 2.0.
15. The method of claim 13, wherein an area within a periphery of said magnetron is no more than ⅙ of an area of said target.
16. The method of claim 13, further comprising admitting nitrogen into said vacuum chamber, whereby tantalum nitride is deposited on said substrate.
17. The method of claim 13, wherein said central axis is located outside of a periphery of the outer pole.
18. A tantalum plasma sputter reactor, comprising:
a vacuum chamber;

a tantalum target disposed on a side of said vacuum chamber;

a pedestal electrode disposed in said vacuum chamber in opposition to said target for supporting a planar substrate to be sputter coated;

an RF power supply connected to said pedestal electrode; and a magnetron asymmetrically placed about the central axis, rotatable about said central axis and including an inner magnetic pole completely displaced away from the central axis on one side thereof and having a first magnetic polarity and a first total magnetic flux and an outer magnetic pole surrounding said inner magnetic pole and having a second magnetic polarity opposite said first magnetic polarity and a second total magnetic flux greater than said first total magnetic flux by a ratio of at least 1.5.

19. The reactor of claim 18, wherein said ratio is at least 2.0.

20. The reactor of claim 18, wherein an area within a periphery of said magnetron is no more than 1/6 of an area of said target.

21. The reactor of claim 18, wherein said central axis is located outside of a periphery of the outer pole.

* * * * *